United States Patent
Emoto

(10) Patent No.: US 10,790,166 B2
(45) Date of Patent: Sep. 29, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventor: Tetsuya Emoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 305 days.

(21) Appl. No.: 15/867,898

(22) Filed: Jan. 11, 2018

(65) Prior Publication Data

US 2018/0247837 A1    Aug. 30, 2018

(30) Foreign Application Priority Data

Feb. 24, 2017   (JP) ................. 2017-033609

(51) Int. Cl.
*H01L 21/67*    (2006.01)
*H01L 21/02*    (2006.01)
*H01L 21/687*   (2006.01)

(52) U.S. Cl.
CPC .. *H01L 21/67034* (2013.01); *H01L 21/02063* (2013.01); *H01L 21/67028* (2013.01); *H01L 21/67051* (2013.01); *H01L 21/68728* (2013.01)

(58) Field of Classification Search
CPC ......... H01L 21/67034; H01L 21/67028; H01L 21/68728; H01L 21/67051; H01L 21/02063; H01L 21/02057; H01L 21/02082
See application file for complete search history.

(56) References Cited

U.S. PATENT DOCUMENTS

| | | | | |
|---|---|---|---|---|
| 6,770,151 B1 * | 8/2004 | Ravkin | ............. | H01L 21/02052 134/33 |
| 7,000,622 B2 * | 2/2006 | Woods | ...................... | B08B 3/04 134/153 |
| 7,156,111 B2 * | 1/2007 | Franklin | ................... | B08B 3/12 134/1 |
| 2003/0192570 A1 * | 10/2003 | Thakur | .................. | B08B 3/024 134/1.3 |
| 2003/0192577 A1 * | 10/2003 | Thakur | .................. | B08B 3/024 134/146 |

(Continued)

FOREIGN PATENT DOCUMENTS

| JP | 2008-098440 A | 4/2008 |
|---|---|---|
| JP | 2010-050143 A | 3/2010 |

(Continued)

*Primary Examiner* — Alexander Markoff
(74) *Attorney, Agent, or Firm* — Ostrolenk Faber LLP

(57) ABSTRACT

A substrate processing method includes a replacing step of replacing the processing liquid with a low surface tension liquid, a liquid film forming step of forming a liquid film of the low surface tension liquid on the upper surface of the substrate, by continuing supplying the low surface tension liquid to the upper surface of the substrate after the replacing step, an opening forming step of forming an opening at a central region of the liquid film, an enlarging removing step of removing the liquid film from the upper surface of the substrate by enlarging the opening toward a peripheral edge of the substrate, and a liquid film contact step of bringing a proximity member into contact with the liquid film, by bringing the proximity member close to the peripheral edge of the substrate after starting the opening forming step.

9 Claims, 14 Drawing Sheets

(56) References Cited

U.S. PATENT DOCUMENTS

| | | | |
|---|---|---|---|
| 2004/0084144 A1* | 5/2004 | Yokouchi | H01L 21/67051 156/345.11 |
| 2005/0145267 A1* | 7/2005 | Korolik | H01L 21/67028 134/30 |
| 2007/0220775 A1* | 9/2007 | Miya | H01L 21/67051 34/351 |
| 2007/0227566 A1* | 10/2007 | Miya | H01L 21/67051 134/95.2 |
| 2008/0081110 A1* | 4/2008 | Winter | H01L 21/6708 427/240 |
| 2009/0151753 A1* | 6/2009 | Woods | H01L 21/67028 134/21 |
| 2009/0176360 A1* | 7/2009 | Garcia | H01L 21/02057 438/597 |
| 2009/0205677 A1* | 8/2009 | Thakur | B08B 3/12 134/1 |
| 2011/0155177 A1 | 6/2011 | Tamura et al. | 134/18 |
| 2013/0061879 A1* | 3/2013 | O'Donnell | H01L 21/6708 134/21 |
| 2014/0231012 A1* | 8/2014 | Hinode | H01L 21/67248 156/345.23 |
| 2014/0259728 A1* | 9/2014 | Ishibashi | H01L 21/02054 34/381 |
| 2014/0332037 A1* | 11/2014 | Korolik | C25D 5/22 134/34 |
| 2015/0234296 A1 | 8/2015 | Yagi | |
| 2015/0243542 A1 | 8/2015 | Yoshihara et al. | |
| 2016/0351421 A1 | 12/2016 | Iwao et al. | |
| 2018/0204743 A1* | 7/2018 | Otsuji | B08B 3/041 |

FOREIGN PATENT DOCUMENTS

| | | |
|---|---|---|
| JP | 2010-056534 A | 3/2010 |
| JP | 2010-177371 A | 8/2010 |
| JP | 2015-153947 A | 8/2015 |
| JP | 2015-162597 A | 9/2015 |
| TW | 201705353 A | 2/2017 |

* cited by examiner

FIG. 8A REPLACING STEP T1
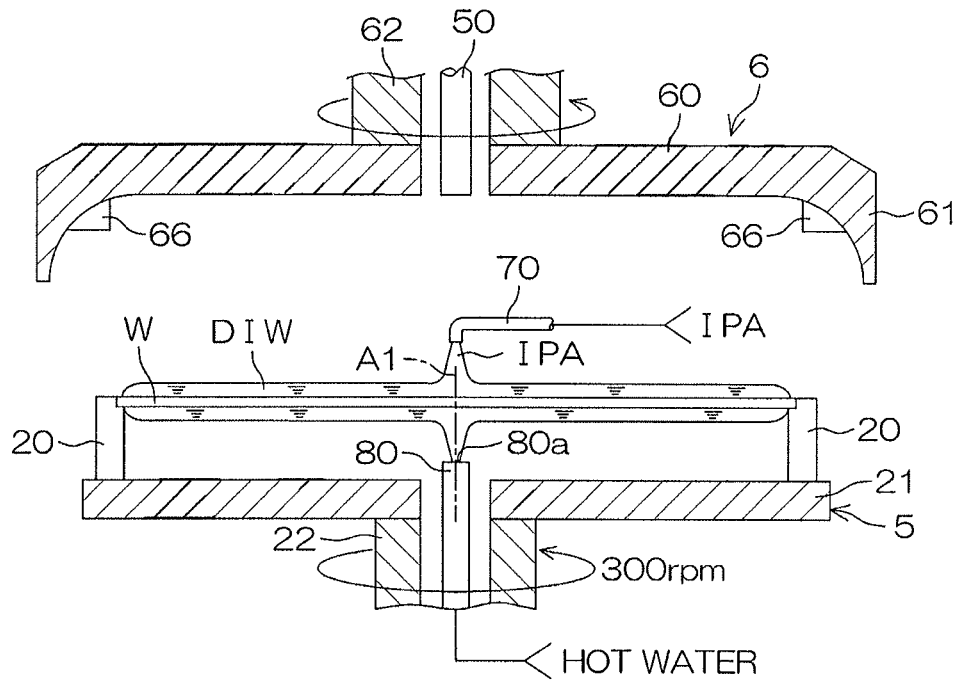
FIG. 8B LIQUID FILM FORMING STEP T2
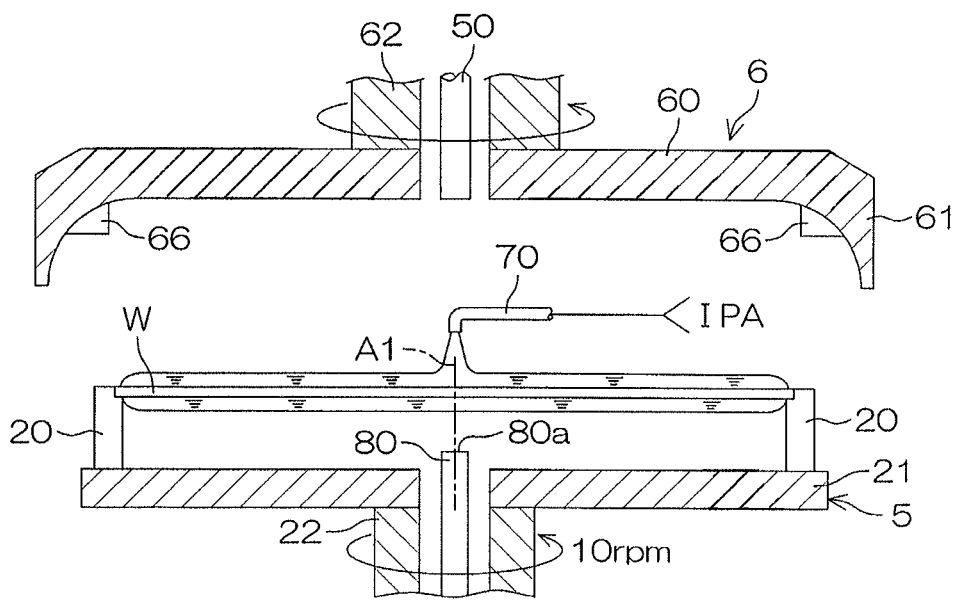

FIG. 8C OPENING FORMING STEP T3
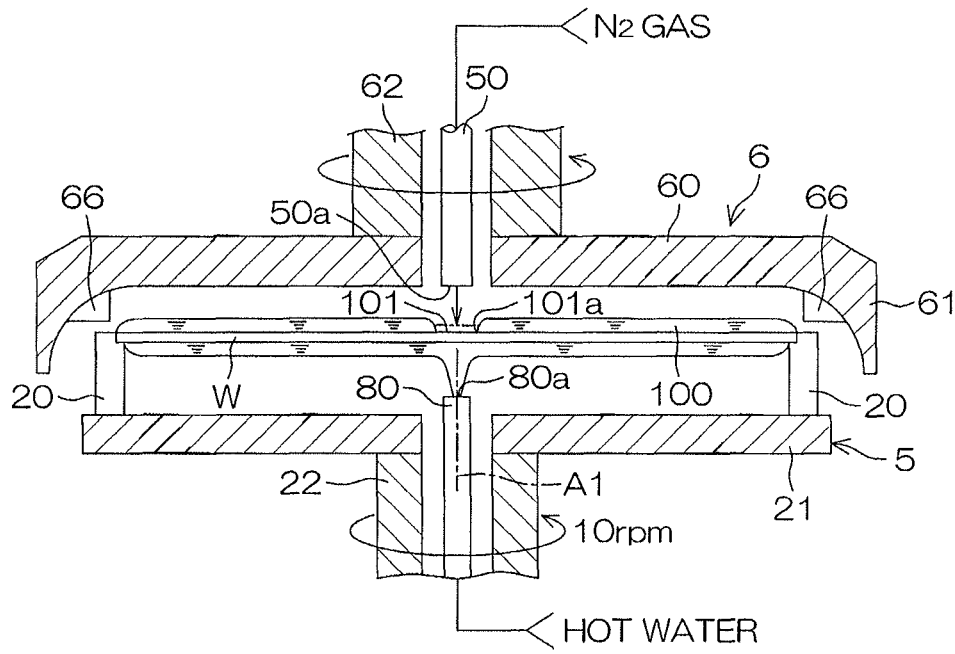
FIG. 8D ENLARGING REMOVING STEP T4
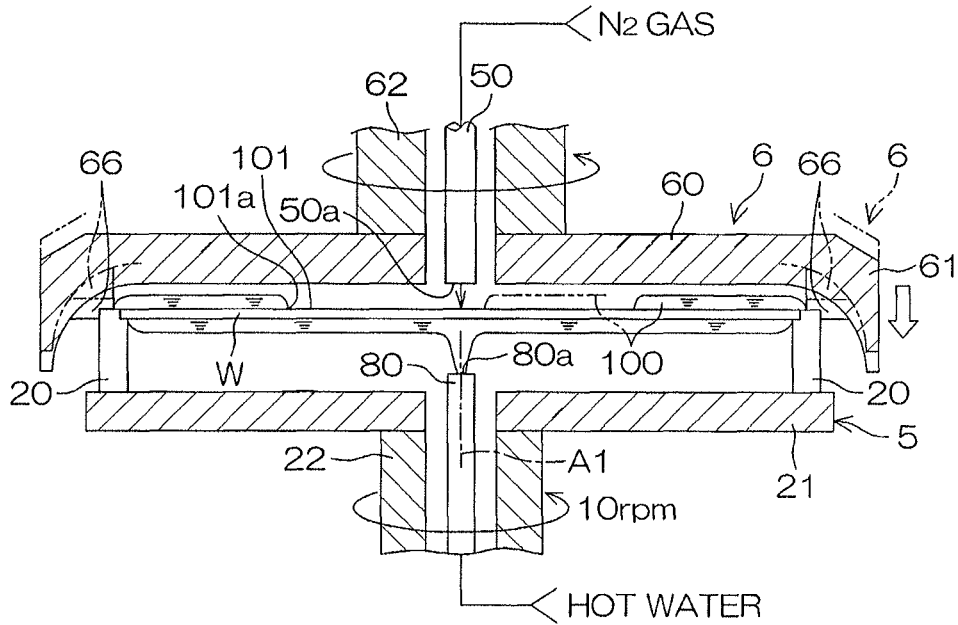

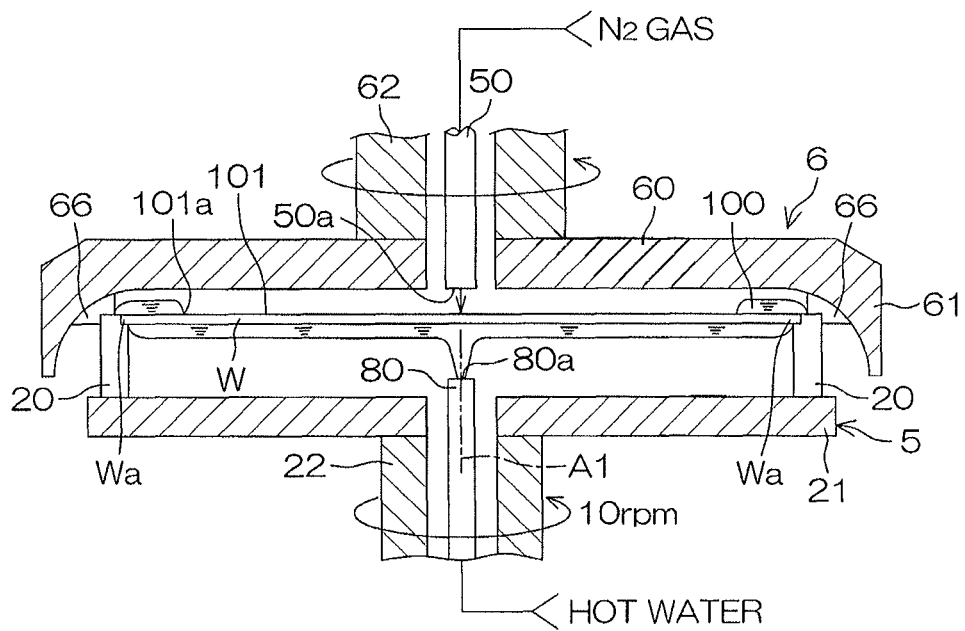
FIG. 8E  ENLARGING REMOVING STEP T4

FIG. 13A  ENLARGING REMOVING STEP T4
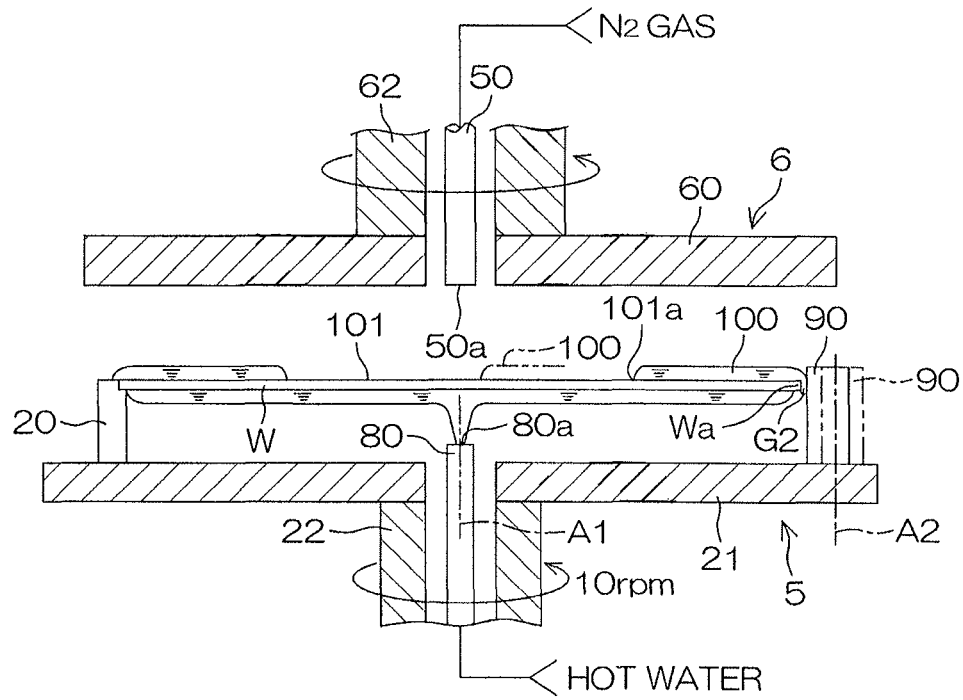
FIG. 13B  ENLARGING REMOVING STEP T4
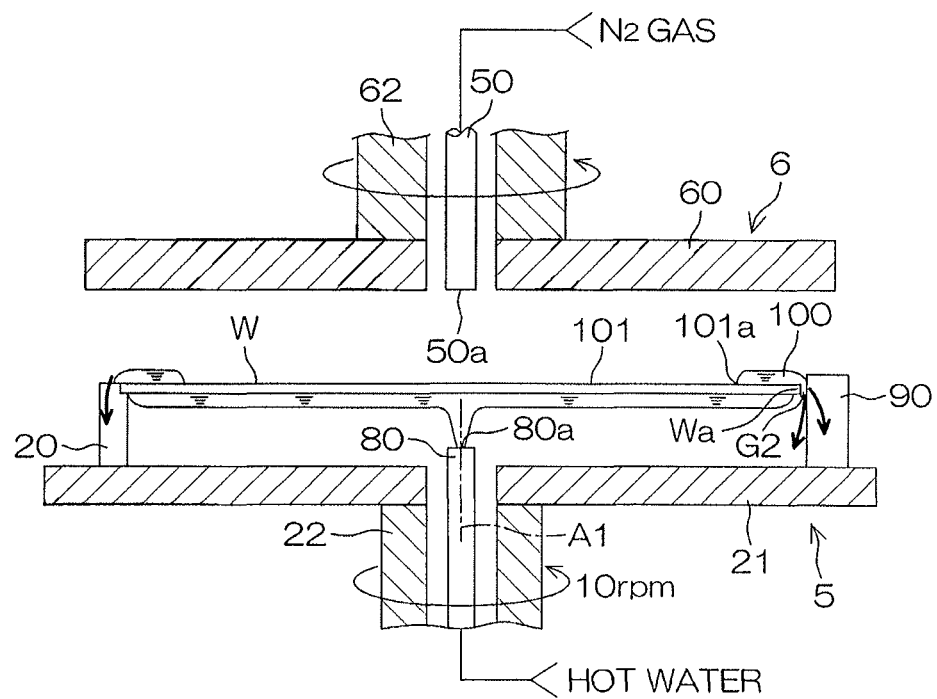

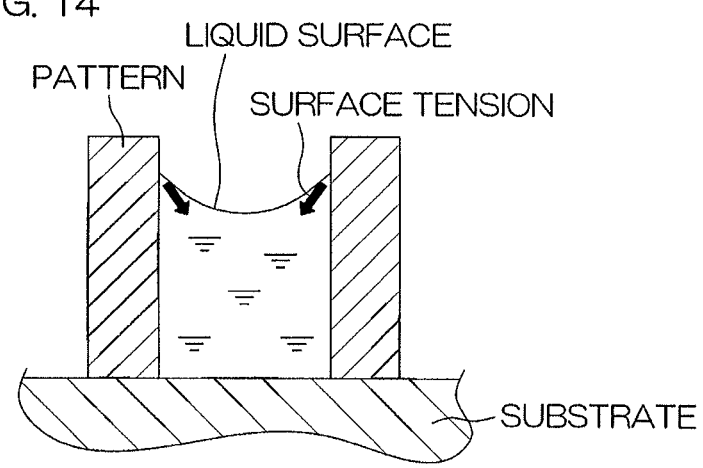

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing a substrate. Examples of substrates to be processed include semiconductor wafers, substrates for liquid crystal displays, substrates for FPD (Flat Panel Display) for organic EL (Electroluminescence) display device, substrates for optical disks, substrates for magnetic disks, substrates for magneto-optical disks, substrates for photomasks, ceramic substrates, substrates for solar cells, etc.

2. Description of the Related Art

In substrate processing performed by a single substrate processing type substrate processing apparatus that processes a substrate one by one, for example, a chemical solution is supplied to the substrate that is held substantially horizontally by means of a spin chuck. Thereafter, a rinse liquid is supplied to the substrate. Therefore, the chemical liquid is replaced with the rinse liquid. Thereafter, a spin drying step is performed to remove the rinse liquid on the substrate.

As shown in FIG. 14, when a fine pattern is formed on a front surface of the substrate, there is a possibility that the rinse liquid that has entered the inside of the pattern cannot be eliminated in the spin drying step. As a result, there is a possibility that a drying failure will occur. Since a liquid surface (an interface between air and liquid) of the rinse liquid that has entered the inside of the pattern is formed inside of the pattern, the surface tension of the liquid acts on contact positions between the liquid surface and the pattern. If the surface tension is high, the pattern collapse will occur easily. Water, which is a typical rinse liquid, is high in surface tension. The pattern collapse in the spin drying step can thus not be ignored.

Therefore, a method in which isopropyl alcohol (IPA), which is an organic solvent having lower surface tension than water, is supplied to replace water that has entered the pattern with IPA and then IPA is removed to dry the upper surface, is conceivable.

In a substrate processing described in Japanese Patent Application Publication No. 2010-177371, a liquid film of water is formed on the substrate, and then the liquid film of water is replaced with IPA. Then, a hole (an opening) is formed in the central part of the liquid film of IPA by blowing with nitrogen gas. As a result, the liquid film is annularized. Then, by rotating the substrate, a centrifugal force acts on IPA on the substrate to increase the inner diameter of the annular liquid film. As a result, the liquid film of IPA is pushed out of the substrate.

SUMMARY OF THE INVENTION

In the substrate processing in which the liquid film of IPA is pushed out of the substrate by enlarging the opening, the force, when IPA located inside the peripheral edge of the substrate pushed out IPA located at the peripheral edge of the substrate, weakens when a peripheral edge of the opening comes close to a peripheral edge of the substrate. As a result, IPA located at the peripheral edge of the substrate is difficult to be pushed out from the substrate. Therefore, enlarging of the opening is stopped when the peripheral edge of the opening reaches near the peripheral edge of the substrate, and the liquid film of IPA may remain at the peripheral edge of the substrate. When the peripheral edge of the substrate naturally dries when IPA which remains at the peripheral edge of the substrate evaporates, a liquid surface of IPA continues to act on the pattern surface tension. As a result, there is a possibility that the pattern collapse will occur.

Therefore, in a substrate processing described in Japanese Patent Application Publication No. 2010-177371, the substrate is rotated at a relatively high speed (700 rpm) when removing the liquid film of IPA from the substrate, is proposed. Therefore, the liquid film of IPA is removed not only from near the center of the upper surface of the substrate but also the peripheral edge of the substrate. However, when IPA is scattered outside the substrate by rotating the substrate at high speed, it is difficult to completely remove the IPA which has entered the inside of the fine pattern of the upper surface of the substrate.

Therefore, one object of the present invention is to provide a substrate processing method and a substrate processing apparatus that can remove a low surface tension liquid on a substrate satisfactorily.

The one preferred embodiment of the present invention provides a substrate processing method including a substrate holding step of holding a substrate horizontally, a processing liquid supplying step of supplying a processing liquid, which contains water, to an upper surface of the substrate, a replacing step of replacing the processing liquid with a low surface tension liquid, which has lower surface tension than water, by supplying the low surface tension liquid to the upper surface of the substrate, a liquid film forming step of forming a liquid film of the low surface tension liquid on the upper surface of the substrate, by continuing supplying the low surface tension liquid to the upper surface of the substrate after the replacing step, an opening forming step of forming an opening at a central region of the liquid film, an enlarging removing step of removing the liquid film from the upper surface of the substrate by enlarging the opening toward a peripheral edge of the substrate, and a liquid film contact step of bringing a proximity member into contact with the liquid film, by bringing the proximity member close to the peripheral edge of the substrate after starting the opening forming step.

According to this method, the liquid film of the low surface tension liquid is formed on the upper surface of the substrate in the liquid film forming step, and the opening is formed in the central region of the liquid film in the opening forming step. Thereafter, the liquid film of the low surface tension liquid is removed from the upper surface of the substrate by enlarging the opening toward the peripheral edge of the substrate in the enlarging removing step. After starting the opening forming step, the proximity member caomes close to the peripheral edge of the substrate and canes in contact with the liquid film of the low surface tension liquid. Therefore, the low surface tension liquid which positions at a vicinity of the peripheral edge of the substrate is removed along the proximity member to the outside of the substrate, even though a force, which pushes the low surface tension liquid positioned on the peripheral edge of the substrate out of the substrate, is reduced due to the peripheral edge of the opening approaching the peripheral edge of the substrate by enlarging of the opening. Therefore, the low surface tension liquid on the upper surface of the substrate is satisfactorily removed without remaining droplets of the low surface tension liquid on the upper surface of the substrate.

In one preferred embodiment of the present invention, the liquid film contact step is performed in parallel with the enlarging removing step. Thus, in the enlarging removing step, the low surface tension liquid near the peripheral edge of the substrate is removed along the proximity member to the outside of the substrate. Therefore, the low surface tension liquid on the upper surface of the substrate is efficiently removed without stopping enlarging the opening.

In one preferred embodiment of the present invention, the proximity member is brought close to the substrate, such that a gap is formed between the proximity member and the peripheral edge of the substrate, in the liquid film contact step. Thus, the low surface tension liquid which positions at the vicinity of the peripheral edge of the substrate can pass the gap between the proximity member and the substrate and the peripheral edge. Therefore, compared to a configuration in which the peripheral edge of the substrate and the proximity member are in contact, the low surface tension liquid which positions at near the peripheral edge of the substrate can be efficiently removed to the outside of the substrate.

In one preferred embodiment of the present invention, the substrate holding step comprises a step of holding the peripheral edge of the substrate by means of a substrate holding tool which is provided on an upper surface of a base and holds the peripheral edge of the substrate. And, in the liquid film contact step, the proximity member is brought close to a part of the peripheral edge of the substrate, which is different from a part which is held by the substrate holding tool.

The low surface tension liquid which positions at the vicinity of the peripheral edge of the substrate is removed not only along the proximity member to the outside of the substrate, but also along the substrate holding tool, which hold the peripheral edge of the substrate, to the outside of the substrate. By bringing the proximity member close to the part of the peripheral edge of the substrate, which is different from the part which is held by the substrate holding tool, the low surface tension liquid which positions at the vicinity of the peripheral edge of the substrate is removed to the outside of the substrate by both the substrate holding tool and the proximity member. Therefore, the low surface tension liquid which positions at the vicinity of the peripheral edge of the substrate can be efficiently removed to the outside of the substrate.

In one preferred embodiment of the present invention, the proximity member is a proximity pin which is provided on the upper surface of the base. And, in the liquid film contact step, the proximity pin is brought close to the peripheral edge of the substrate from the outside of the substrate. Thus, it is possible to bring the proximity member into contact with the liquid film with a simple configuration of bringing the proximity pin which is provided on the base from the outside of the substrate to the peripheral edge of the substrate. Therefore, there is no need to purposely set up a member which is independent from the base.

In one preferred embodiment of the present invention, the proximity member is provided at a blocking member which faces the upper surface of the substrate and blocks an atmosphere between the substrate and the blocking member from a surrounding atmosphere. And, in the liquid film contact step, the blocking member is bought close to the peripheral edge of the substrate from above. By bringing the blocking member close to the peripheral edge of the substrate from above, the proximity member can be brought into contact with the liquid film. The blocking member blocks the atmosphere between the substrate and the blocking member from the surrounding atmosphere, so that contamination of the liquid film of the low surface tension liquid and the substrate due to the surrounding atmosphere can be suppressed or prevented.

In one preferred embodiment of the present invention, the liquid film forming step comprises a step of forming the liquid film on the upper surface of the substrate in a state where a temperature of the low surface tension liquid on the substrate is kept below or equal to a boiling point of the low surface tension liquid. Thus, the temperature of the low surface tension liquid on the substrate is kept below the boiling point, so that evaporation of the low surface tension liquid can be suppressed. Therefore, splitting of the liquid film due to evaporation of the low surface tension liquid can be suppressed or prevented. Accordingly, the lumpy liquid film is removed to the outside of the substrate, so that the low surface tension liquid on the substrate can be satisfactorily removed without remaining droplets of the low surface tension liquid on the upper surface of the substrate.

In one preferred embodiment of the present invention, the opening forming step comprises a step of forming the opening in the liquid film, by raising a temperature of the central region of the liquid film to a temperature which is higher than the temperature of the liquid film in the liquid forming step. Thus, the liquid film of the low surface tension liquid is formed in the central region of the liquid film. Therefore, in the enlarging removing step, the opening can be spread evenly from the central region of the substrate toward the peripheral edge of the substrate. Therefore, the low surface tension liquid can be evenly removed from the upper surface of the substrate.

In one preferred embodiment of the present invention, the enlarging removing step comprises a step of heating the substrate such that a convection in a direction away from the substrate occurs in a gas liquid interface of the liquid film which positions at the peripheral edge of the opening, thereby enlarging the opening toward the peripheral edge of the substrate.

According to this method, in the gas liquid interface of the liquid film at the peripheral edge of the opening which is formed in the central region of the liquid film of the low surface tension liquid, the convection in the direction away from the substrate occurs. This convection causes spontaneous movement toward the direction of the widening the opening, thereby the opening is enlarged. Therefore, the low surface tension liquid on the upper surface of the substrate is more satisfactorily removed without remaining droplets of the low surface tension liquid on the upper surface of the substrate.

The one preferred embodiment of the present invention provides a substrate processing apparatus including a substrate holding unit which holds a substrate horizontally, a processing liquid supplying unit which supplies a processing liquid which contains water, a low surface tension liquid supplying unit which supplies a low surface tension liquid, which has lower surface tension than water, to the substrate, a proximity member which is close to a peripheral edge of the substrate, a relative position changing unit which changes relative position between the proximity member and the substrate, and a controller which controls the substrate holding unit, the processing liquid supplying unit, the low surface tension liquid supplying unit and the relative position changing unit. And, the controller is programmed to perform a substrate holding step of holding the substrate horizontally by means of the substrate holding unit, a processing liquid supplying step of supplying the processing liquid from the processing liquid supplying unit toward the upper surface of the substrate, a replacing step of replacing the processing liquid with the low surface tension liquid, by supplying the low surface tension liquid from the low surface tension liquid supplying unit toward the upper surface of the substrate, a liquid film forming step of forming a liquid film of the low surface tension liquid on the upper surface of the substrate, by continuing supplying the low surface tension liquid from the low surface tension liquid supplying unit to the upper surface of the substrate after the replacing step, an opening forming step of forming an opening in a central region of the liquid film, an enlarging removing step of enlarging the opening toward the peripheral edge of the substrate, and a liquid film contact step of bringing the proximity member into contact with the liquid film, by changing relative position between the proximity member and the substrate by means of the relative position changing unit after starting the opening forming step.

According to this configuration, the liquid film of the low surface tension liquid is formed on the upper surface of the substrate in the liquid film forming step, and the opening is formed in the central region of the liquid film in the opening forming step. Thereafter, the liquid film of the low surface tension liquid is removed from the upper surface of the substrate by enlarging the opening toward the peripheral edge of the substrate in the enlarging removing step. After starting the opening forming step, the proximity member comes close to the peripheral edge of the substrate and comes in contact with the liquid film of the low surface tension liquid. Therefore, the low surface tension liquid which positions at the vicinity of the peripheral edge of the substrate is removed along the proximity member to the outside of the substrate, even though a force, which pushes the low surface tension liquid positioned on the peripheral edge of the substrate out of the substrate, is reduced due to the peripheral edge of the opening approaching the peripheral edge of the substrate by enlarging of the opening. Therefore, the low surface tension liquid on the upper surface of the substrate is satisfactorily removed without remaining droplets of the low surface tension liquid on the upper surface of the substrate.

In one preferred embodiment of the present invention, the controller is programmed to perform the liquid film contact step in parallel with the enlarging removing step. Therefore, in the enlarging removing step, the low surface tension liquid near the peripheral edge of the substrate is removed along the proximity member to the outside of the substrate. Therefore, the low surface tension liquid on the upper surface of the substrate is efficiently removed without stopping enlarging the opening.

In one preferred embodiment of the present invention, the controller is programmed to control the relative position changing unit to bring the proximity member close to the peripheral edge of the substrate, such that a gap is formed between the proximity member and the peripheral edge of the substrate. Therefore, the low surface tension liquid which positions at the vicinity of the peripheral edge of the substrate can pass the gap between the proximity member and the substrate and the peripheral edge. Therefore, compared to a configuration in which the peripheral edge of the substrate and the proximity member are in contact, the low surface tension liquid which positions at near the peripheral edge of the substrate can be efficiently removed to the outside of the substrate.

In one preferred embodiment of the present invention, the substrate holding unit comprises a substrate holding tool which is provided on an upper surface of base and holds the peripheral edge of the substrate. And, the controller is programmed to control the relative position changing unit to bring the proximity member close to a part of the peripheral edge of the substrate, which is different from a part which is held by the substrate holding tool, in the liquid film contact step.

As mentioned above, the low surface tension liquid which positions at the vicinity of the peripheral edge of the substrate is removed not only along the proximity member to the outside of the substrate, but also along the substrate holding tool, which hold the peripheral edge of the substrate, to the outside of the substrate. By bringing the proximity member close to the part of the peripheral edge of the substrate, which is different from the part which is held by the substrate holding tool, the low surface tension liquid which positions at the vicinity of the peripheral edge of the substrate is removed to the outside of the substrate by both the substrate holding tool and the proximity member. Therefore, the low surface tension liquid which positions at the vicinity of the peripheral edge of the substrate can be efficiently removed to the outside of the substrate.

In one preferred embodiment of the present invention, the proximity member is a proximity pin which is provided on the upper surface of the base. And, the controller is programmed to control the relative position changing unit to bring the proximity member close to the peripheral edge of the substrate from the outside of the substrate in the liquid film contact step. Thus, it is possible to bring the proximity member into contact with the liquid film with a simple configuration of bringing the proximity pin which is provided on the base from the outside of the substrate to the peripheral edge of the substrate. Therefore, there is no need to purposely set up a member which is independent from the base.

In one preferred embodiment of the present invention, the proximity member is provided in a blocking member which faces the upper surface of the substrate and blocks an atmosphere between the substrate and the blocking member from a surrounding atmosphere. And, the controller is programmed to bring the blocking member close to the peripheral edge of the substrate from above in the liquid film contact step. By bringing the blocking member close to the peripheral edge of the substrate from above, the proximity member can be brought into contact with the liquid film. The blocking member blocks the atmosphere between the substrate and the blocking member from the surrounding atmosphere, so that contamination of the liquid film of the low surface tension liquid and the substrate due to the surrounding atmosphere can be suppressed or prevented.

In one preferred embodiment of the present invention, the substrate processing apparatus further includes a substrate heating unit which heats the substrate. And, the controller is programmed to control the substrate heating unit so as to keep a temperature of the low surface tension liquid on the substrate below or equal to a boiling point of the low surface tension liquid in the liquid film forming step. Thus, the temperature of the low surface tension liquid on the substrate is kept below or equal to the boiling point, so that evaporation of the low surface tension liquid can be suppressed. Therefore, splitting of the liquid film due to evaporation of the low surface tension liquid can be suppressed or prevented. Therefore, the lumpy liquid film is removed to the outside of the substrate, so that the low surface tension liquid on the substrate can be satisfactorily removed without remaining droplets of the low surface tension liquid on the upper surface of the substrate.

In one preferred embodiment of the present invention, the controller is programmed to control the substrate heating unit in the opening forming step, so as to form the opening in the liquid film by raising a temperature of the central region of the liquid film to a temperature which is higher than the temperature of the liquid film, in the liquid forming step. Thus, the liquid film of the low surface tension liquid is formed in the central region of the liquid film. Therefore, in the enlarging removing step, the opening can be spread evenly from the central region of the substrate toward the peripheral edge of the substrate. Therefore, the low surface tension liquid can be evenly removed from the upper surface of the substrate.

In one preferred embodiment of the present invention, the controller is programmed to control the substrate heating unit, such that a convection in a direction away from the substrate occurs in a gas liquid interface of the liquid film which positions at the peripheral edge of the opening in the enlarging removing step, thereby enlarging the opening toward the peripheral edge of the substrate. Thus, in the gas liquid interface of the liquid film at the peripheral edge of the opening which is formed in the central region of the liquid film of the low surface tension liquid, the convection in the direction away from the substrate occurs. This convection causes spontaneous movement toward a direction of the widening the opening, thereby the opening is enlarged. Therefore, the low surface tension liquid on the upper surface of the substrate is more satisfactorily removed without remaining droplets of the low surface tension liquid on the upper surface of the substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8A to FIG. 8E are schematic sectional views for explaining the organic solvent processing (S4 of FIG. 6).

FIG. 13A to FIG. 13B are schematic sectional views for explaining the organic solvent process (S4 of FIG. 6) in a substrate processing performed by the substrate processing apparatus according to the second embodiment.

FIG. 14 is a schematic sectional view to explain the principle of a pattern collapse caused by surface tension.

DETAILED DESCRIPTION OF THE PREFERRED EMBODIMENTS

First Preferred Embodiment

Figure 1:
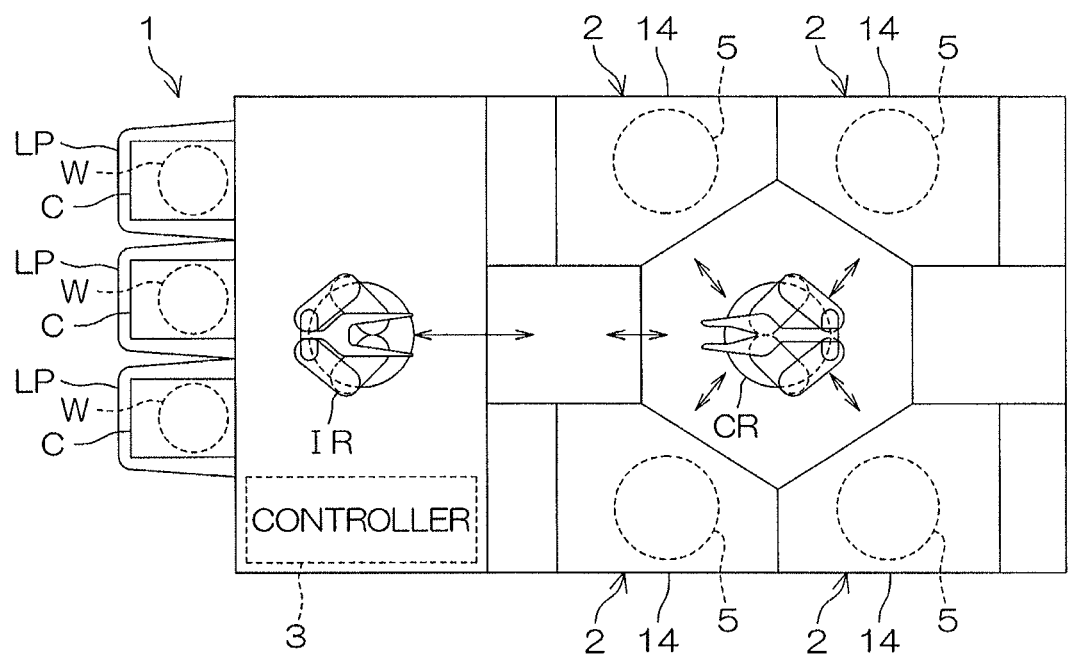
FIG. 1 is a schematic plan view for explaining a layout of the interior of a substrate processing apparatus according to a first preferred embodiment of the present invention.

FIG. 1 is an schematic plan view for explaining a layout of the interior of a substrate processing apparatus 1 according to a first preferred embodiment of the present invention.

The substrate processing apparatus 1 is a single substrate processing type apparatus that processes a substrate W, such as a silicon wafer, one by one. In the present preferred embodiment, the substrate W is a circular substrate. The substrate processing apparatus 1 includes a plurality of processing units 2 each of which processes the substrate W by use of a processing liquid such as a chemical liquid, a rinse liquid and the like, a plurality of load ports LP each of which holds a carrier C that houses a plurality of the substrates W to be processed by the processing units 2, transfer robots IR and CR that transfer the substrates W between the load ports LP and the processing units 2, and a controller 3 that controls the substrate processing apparatus 1. The transfer robot IR transfers the substrate W between the carriers C and the transfer robot CR. The transfer robot CR transfers the substrate W between the transfer robot IR and the processing units 2. The plurality of processing units 2 have, for example, the same configuration.

Figure 2:
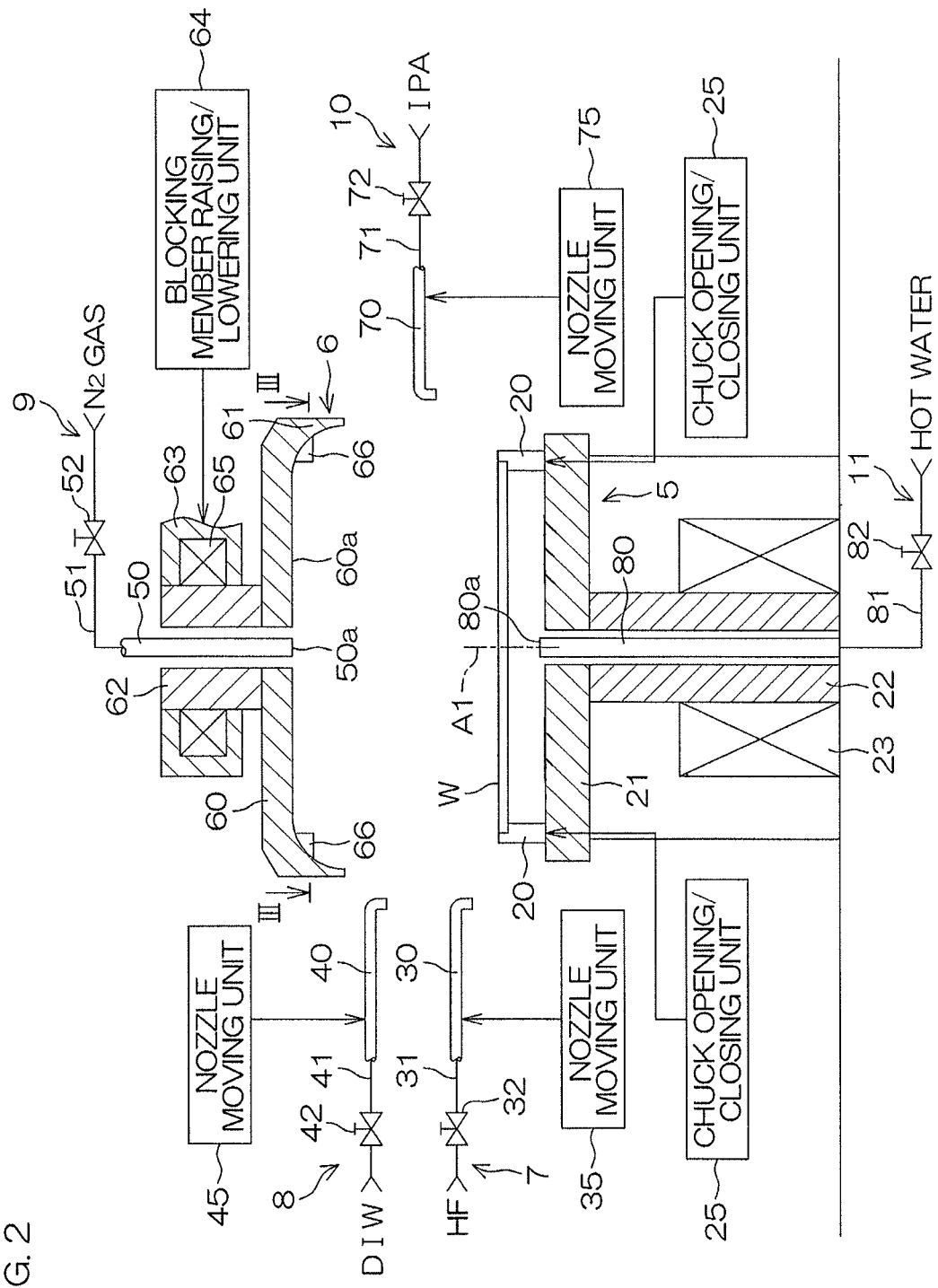
FIG. 2 is a schematic view to explain a configuration example of a processing unit included in the substrate processing apparatus.

FIG. 2 is a schematic view to explain a configuration example of a processing unit 2.

the processing unit 2 includes a spin chuck 5 which rotates the substrate W around a vertical rotational axis A1 passing through a central portion of the substrate while holding one substrate W in a horizontal attitude, and a blocking member 6 which has a facing surface 60a facing an upper surface (an upper main surface) of the substrate W. The blocking member 6 blocks an atmosphere between the upper surface of the substrate W and the facing surface 60a of the blocking member 6 from a surrounding atmosphere. The surrounding atmosphere means an atmosphere outside the space the upper surface of the substrate W and the facing surface 60a. The blocking member 6 need only be able to limit the flow between the atmosphere between the blocking member 6 and the upper surface of the substrate W and the surrounding atmosphere, and does not need to be a member which completely block the atmosphere between the blocking member 6 and the upper surface of the substrate W from the surrounding atmosphere.

The processing unit 2 further includes a chemical liquid supplying unit 7 which supplies a chemical liquid to the upper surface of the substrate W, a rinse liquid supplying unit 8 which supplies a rinse liquid such as DIW (Deionized Water) to the upper surface of the substrate. The processing unit 2 further includes a gas supplying unit 9 which supplies a gas such as nitrogen ($N_2$) gas to the upper surface of the substrate W, an organic solvent supplying unit 10 which supplies an organic solvent such as IPA to the upper surface of the substrate, and a heating fluid supplying unit 11.

The processing unit 2 includes a chamber 14 (see FIG. 1) which houses the spin chuck 5. A carry-in/carry-out port (not shown) that carries in the substrate W to the chamber 14 and carries out the substrate W from the chamber 14 is formed in the chamber 14. The chamber 14 is provided with a shutter unit (not shown) that opens and closes the carry-in/carry-out port.

The spin chuck 5 includes a plurality of chuck pins 20, a spin base 21 (a base), a rotational shaft 22, and an electric motor 23. the rotational shaft 22 extends in the vertical direction along the rotational axis A1. An upper end of the rotational shaft 22 is joined to a center of a lower surface of the spin base 21.

The spin base 21 has a disk shape along a horizontal direction. The plurality of the chuck pins 20 are disposed at intervals in a circumferential direction at a peripheral edge of an upper surface of the spin base 21. The spin base 21 and the plurality of the chuck pins 20 are included in a substrate holding unit which holds the substrate W horizontally. The plurality of chuck pins 20 are an example of a substrate holding tool which is provided on the upper surface of the spin base 21 and holds a peripheral edge of the substrate W. The substrate holding unit is also called a substrate holder.

A chuck opening/closing unit 25 is provided in order to open/close the chuck pin 20. The chuck opening/closing unit 25 includes, for example, a link mechanism and a drive source. The drive source includes, for example, a ball screw mechanism and an electric motor that provides driving force to the ball screw mechanism.

The electric motor 23 gives a driving force to the rotational shaft 22. The spin base 21 is rotated as the rotational shaft 22 is rotated by the electric motor 23. Thus, the substrate W is rotated around the rotational axis A1. The electric motor 23 is included in a substrate rotating unit that rotates the substrate W around the rotational axis A1.

The blocking member 6 includes a facing part 60 which faces the upper surface of the substrate W, and a annular part 61 which extends downward from a peripheral edge of the facing part 60 so as to surround the substrate W in plan view. The facing part 60 is formed in a disk shape. The facing part 60 is arranged almost horizontally above the spin chuck 5. The facing part 60 has the facing surface 60a which faces the upper surface of the substrate W. A rotational shaft 62 is fixed to a surface of the facing part 60 which is opposite to the facing surface 60a in the facing part 60. An inner peripheral surface of the annular part 61 is curved so as to go outward in a rotational radial direction as going downward. An outer peripheral surface of the annular part 61 extends the vertical direction.

The processing unit 2 further includes a blocking member supporting member 63, a blocking member raising/lowering unit 64, and a blocking member rotating unit 65. The blocking member supporting member 63 extends horizontally and supports the blocking member 6 through the rotational shaft 62. The blocking member raising/lowering unit 64 is connected to the blocking member 6 through the blocking member supporting member 63 and drives the raising/lowering of the blocking member 6. The blocking member raising/lowering unit 64 includes, for example, a ball screw mechanism and an electric motor that provides driving force to the ball screw mechanism. The blocking member rotating unit 65 rotates the blocking member 6 around the rotational axis A1. The blocking member rotating unit 65 includes, for example, an electric motor which rotates the rotational shaft 62.

The blocking member raising/lowering unit 64 can position the blocking member 6 at an arbitrary positon from a lower position (a positions shown in FIGS. 8D and 8E which will be described later) to an upper position (a positions shown in FIGS. 8A and 8B which will be described later). The lower position is a position at which the facing part 60 of the blocking member 6 is the closest to the upper surface of the substrate W in the movable range of the blocking member 6. The upper position is a position at which the facing part 60 of the blocking member 6 is the most separated from the upper surface of the substrate W in the movable range of the blocking member 6.

The chemical liquid supplying unit 7 includes a chemical liquid nozzle 30, a chemical liquid supply pipe 31 and a chemical liquid supply valve 32. The chemical liquid nozzle 30 supplies the chemical liquid to the upper surface of the substrate W. The chemical liquid supply pipe 31 is connected to the chemical liquid nozzle 30. The chemical liquid such as Hydrofluoric acid (hydrogen fluoride water: HF) is supplied from a chemical liquid source to the chemical liquid supply pipe 31. The chemical liquid supply valve 32 is interposed in the chemical liquid supply pipe 31.

The chemical liquid is not limited to hydrofluoric acid but may be a liquid containing at least one of sulfuric acid, acetic acid, nitric acid, hydrochloric acid, hydrofluoric acid, buffered hydrofluoric acid (BHF), dilute hydrofluoric acid (DHF), aqueous amonia, aqueous hydrogen peroxide, organic acid (For example, citric acid, oxalic acid etc.), organic alkali (For example TMAH: tetramethylamonium hydroperoxide, etc.), a surfactant, and a corrosion inhibitor. Examples of the chemical liquid obtained mixing them includes SPM (sulfuric acid/hydrogen peroxide mixture), SC1 (amnonia-hydrogen peroxide mixture), SC2 (hydrochloric acid/hydrogen peroxide mixture mixture) and the like.

The chemical liquid nozzle 30 is moved in the vertical direction (a direction parallel to the rotational axis A1) and in the horizontal direction (a direction perpendicular to the rotational axis A1) by a chemical liquid nozzle moving unit 35. The chemical liquid nozzle 30 can move between a central position and a retreat position by movement in the horizontal direction. The chemical liquid nozzle 30 faces a rotation center position of the upper surface of the substrate, when the chemical liquid nozzle 30 positions at the central position. The rotation center position is a position of intersection with the rotational axis A1 on the upper surface of the substrate W. The chemical liquid nozzle 30 does not face the upper surface of the substrate W, when the chemical liquid nozzle 30 positions at the retreat position.

The rinse liquid supplying unit 8 includes a rinse liquid nozzle 40, a rinse liquid supply pipe 41, and a rinse liquid supply valve 42. The rinse liquid nozzle 40 supplies the rinse liquid to the upper surface of the substrate W. The rinse liquid supply pipe 41 is connected to the rinse liquid nozzle 40. The rinse liquid is supplied from a rinse liquid supply source to the rinse liquid supply pipe 41. The rinse liquid supply valve 42 is interposed in the rinse liquid supply pipe 41.

The rinse liquid is not limited to DIW, but may be carbonated water, electrolytic ionized water, ozone water, hydrochloric acid water of dilution concentration (for example, about 10 ppm to 100 ppm), reduced water (hydrogen water). The rinse liquid contains water. The rinse liquid supplying unit 8 is an example of a processing liquid supplying unit which supplies the processing liquid containing water.

The rinse liquid nozzle 40 is moved in the vertical direction (a direction parallel to the rotational axis A1) and in the horizontal direction (a direction perpendicular to the rotational axis A1) by a rinse liquid nozzle moving unit 45. The rinse liquid nozzle 40 can move between a central position and a retreat position by movement in the horizontal direction. The rinse liquid nozzle 40 faces the rotation center position of the upper surface of the substrate W, when the rinse liquid nozzle 40 positions at the central position. The rinse liquid nozzle 40 does not face the upper surface of the substrate W, when the rinse liquid nozzle 40 positions at the retreat position.

the gas supplying unit 9 includes a gas nozzle 50 which supplies the gas such as nitrogen gas to a central region of the upper surface of the substrate W, a gas supply pipe 51 which is connected to the gas nozzle 50, and a gas valve 52 which is interposed in the gas supply pipe 51 and opens and closes the gas flow path. The gas such as nitrogen gas to the gas supply pipe 51 to a gas supply source. The central region is a region which includes the rotation center of the upper surface of the substrate W.

An inert gas such as nitrogen gas is preferable as the gas supplies from the gas supply source to the gas supply pipe 51. The inert gas is not limited to nitrogen gas, but may be a gas which is inert to the upper surface of the substrate W and the pattern. As an example of the inert gas, besides nitrogen gas, rare gases such as argon can be mentioned. The gas nozzle 50 is inserted through the rotational shaft 62. A discharge port 50*a* of the gas nozzle 50 is exposed from through hole which penetrates the facing part 60 of the blocking member 6 vertically, and faces the upper surface of the substrate W. The gas nozzle 50 is supported by the rotational shaft 62 through, for example, a bearing (not shown). The gas nozzle 50 is raised or lowered by the blocking member raising/lowering unit 64 together with the blocking member 6.

The organic solvent supplying unit 10 includes an organic solvent nozzle 70, an organic solvent supply pipe 71, and an organic solvent valve 72. The organic solvent nozzle 70 supplies the organic solvent to the upper surface of the substrate W. The organic solvent supply pipe 71 is connected to the organic solvent nozzle 70. The organic solvent such as IPA is supplied from an organic solvent source to the organic solvent supply pipe 71. The organic solvent valve 72 is interposed in the organic solvent supply pipe 71.

The organic solvent nozzle 70 is moved the vertical direction (a direction parallel to the rotational axis A1) and the horizontal direction (a direction perpendicular to the rotational axis A1) by an organic solvent nozzle moving unit 75. The organic solvent nozzle 70 can move between a central position and a retreat position by movement in the horizontal direction. The organic solvent nozzle 70 faces the rotation center position of the upper surface of the substrate W, when the organic solvent nozzle 70 positions at the central position. The organic solvent nozzle 70 does not face the upper surface of the substrate W, when the organic solvent nozzle 70 positions at the retreat position. The organic solvent supplying unit 10 may function as a low surface tension liquid supplying unit which supplies the low surface tension liquid, which has lower surface tension than water, to the central region of the upper surface of the substrate W.

As the low surface tension liquid, organic solvents other than IPA can be used. The low surface tension liquid may be an organic solvent which does not chemically react (has poor reactivity) with the upper surface of the substrate W and the pattern which is formed on the substrate W (see FIG. 14). More specifically, a liquid containing at least one of IPA, HFE (hydrofluoroether), methanol, ethanol, acetone and trans-1,2-dichloroethylene can be used as the low surface tension liquid. Additionally, the low surface tension liquid is not necessarily composed of only a single component but may be a liquid mixed with other components. For example, the low surface tension liquid may be a mixed solution of IPA liquid and pure water, or a mixed liquid of IPA liquid and HFE liquid.

The heating fluid supplying unit 11 includes a heating fluid nozzle 80, a heating fluid supply pipe 81 and a heating fluid valve 82. The heating fluid nozzle 80 supplies the heating fluid toward a lower surface of the substrate W. The heating fluid supply pipe 81 is connected to the heating fluid nozzle 80. The heating fluid is supplied from a heating fluid supply source to the heating fluid supply pipe 81. The heating fluid valve 82 is interposed in the heating fluid supply pipe 81.

the heating fluid nozzle 80 is inserted through the rotational shaft 22 and has a discharge port 80*a* which faces a center of the lower surface of the substrate W. The central region of the substrate W is especially heated by supply of the heating fluid to the center of the lower surface of the substrate W. The heating fluid supplying unit 11 is an example of a substrate heating unit which heats the substrate W.

The heating fluid which is supplied to the heating fluid nozzle 80 is, for example, a hot water. A hot water is a water of which temperature is higher than room temperature and is a water of which temperature is 80° C. to 85° C. The heating fluid is not limited to a hot water, but may be a gas such as nitrogen gas with high temperature. The heating fluid may be any fluid as long as it can heat the substrate W.

The blocking member 6 includes a plurality of protrusion parts 66 which project downward and inward in the rotational radial direction of the substrate W from the inner peripheral surface of the annular part 61 of the blocking member 6.

Figure 3:
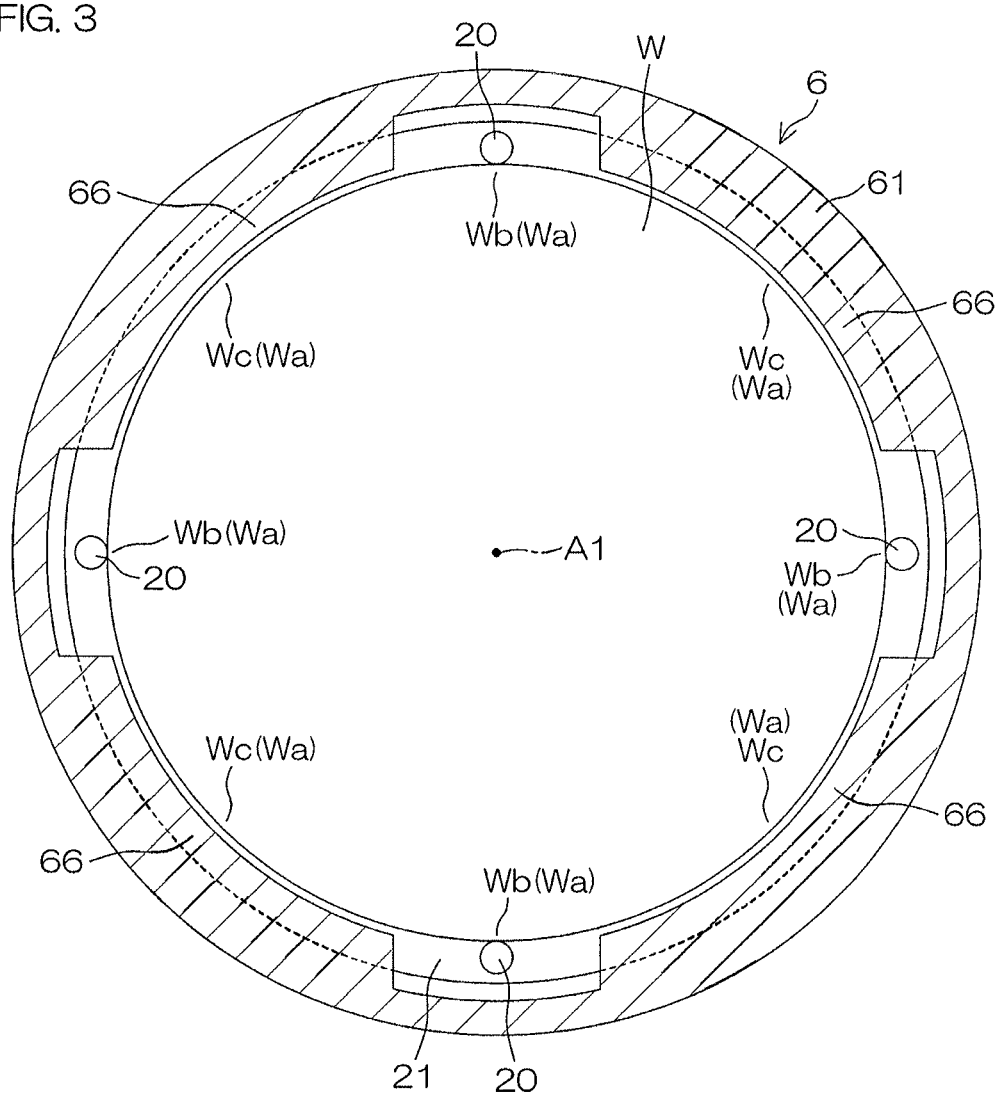
FIG. 3 is a schematic sectional view taken along line III-III in FIG. 2.

FIG. 3 is a schematic sectional view taken along line III-III in FIG. 2. The chuck pin 20 is disposed at intervals in a radial direction around the rotational axis A1. The protrusion part 66 is disposed at intervals in the radial direction around the rotational axis A1. The protrusion parts 66 are provided in the same number as the chuck pin 20 and is four in the present embodiment. By aligning the blocking member 6 and the spin base 21 in the rotational direction, one protrusion part 66 can be placed between the chuck pins 20 adjacent in the rotational direction in plan view. The protrusion part 66 extends along the peripheral edge of the substrate W in the rotational direction. In plan view, the protrusion part 66 is located outside the substrate W rather than the peripheral edge of the substrate W.

Figure 4:
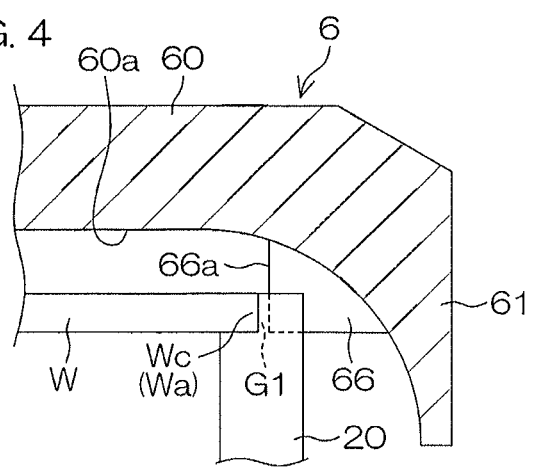
FIG. 4 is a schematic view of a vicinity of a proximity member which is provide in a blocking member and shows a state in which the blocking member positions at a lower position.

FIG. 4 is a schematic view of a vicinity of the protrusion part 66 and shows a state in which the blocking member 6 positions at the lower position. In the state in which the blocking member 6 positions at low position, the protrusion part 66 faces the peripheral edge of the substrate W from outward in the rotational radial direction of the substrate W. An inner peripheral surface of the protrusion part 66 functions a proximity facing surface 66*a* which faces the substrate W from outward in the rotational radial direction of the substrate W in the state where the blocking member 6 positions at the low position. In the state where the blocking member 6 positions at low position, A gap G1 is formed between the inner peripheral surface 66a of the protrusion part 66 and the peripheral edge of the substrate W. In the state where the blocking member 6 positions at the low position, the protrusion part 66 of the blocking member 6 is close to a part Wc in the peripheral edge Wa of the substrate W, which is a different from a part Wb (see FIG. 3) which is held by the chuck pin 20 the substrate W in the peripheral edge Wa of the substrate W. In the state where the blocking member 6 positions at the upper position (in the state shown in FIG. 2), the blocking member 6 retreats to the upper side from the substrate W, so that the protrusion part 66 does not face the substrate W from outward in the rotational radial direction of the substrate W.

Like this, the protrusion part 66 of the blocking member 6 is an example of a proximity member which can get close to the peripheral edge of the substrate W. The blocking member raising/lowering unit 64 functions a relative position changing unit which changes a relative position between the protrusion part 66 as the proximity member and the substrate W.

Figure 5:
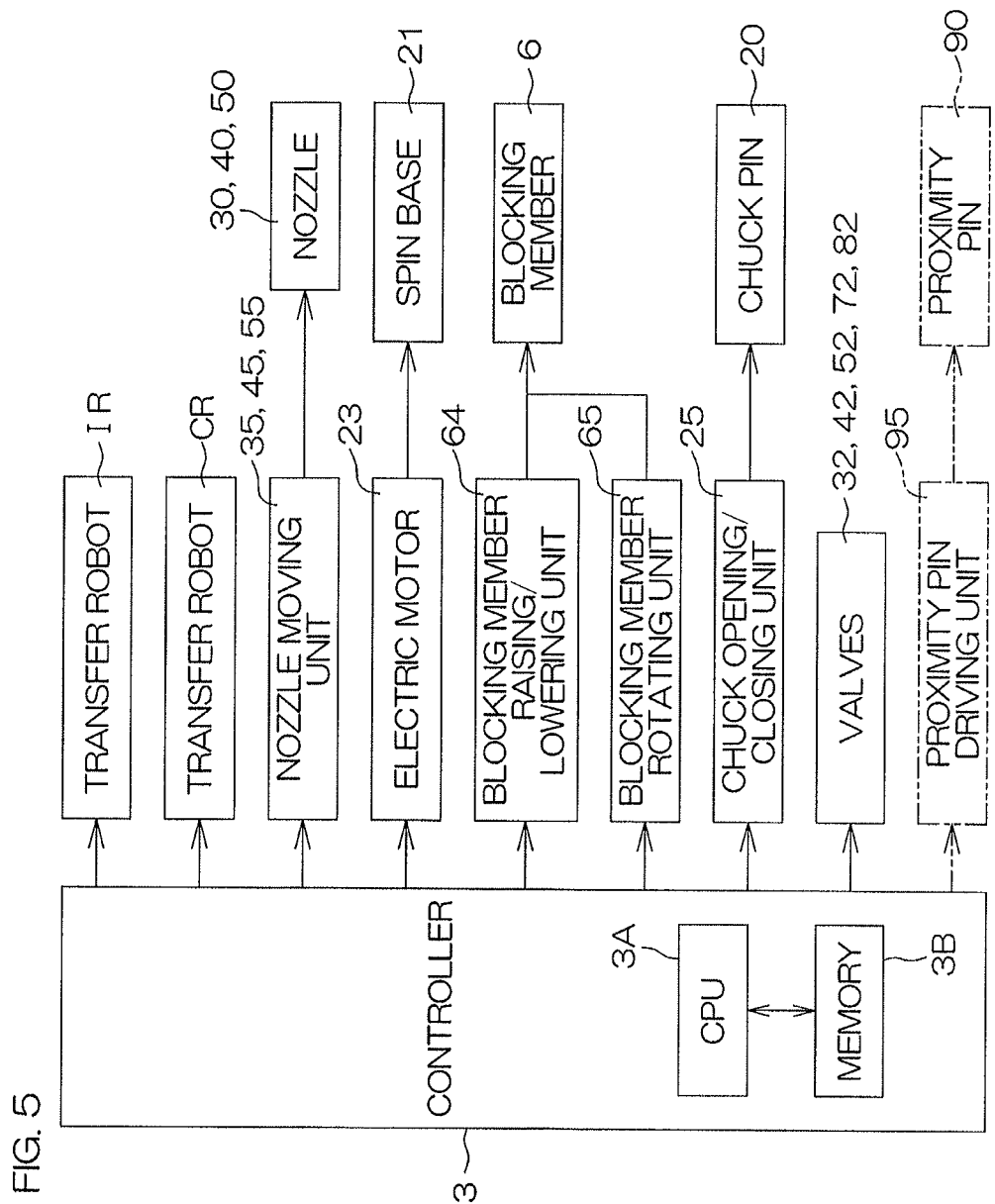
FIG. 5 is a block diagram to explain an electric configuration of a main part of the substrate processing apparatus.

FIG. 5 is a block diagram to explain an electric configuration of a main part of the substrate processing apparatus 1. The controller 3 includes a microcomputer, and controls the control objects included in the substrate processing apparatus 1 in accordance with a predetermined control program. More specifically, the controller 3 includes a processor (CPU) 3A and a memory 3B in which a control program is stored, and is configured to perform various controls for substrate processing by executing the control program by the processor 3A. Particularly, the controller 3 controls operations of the transfer robots IR and CR, the nozzle moving unit 35, 45, 55, the electric motor 23, the blocking member raising/lowering unit 64, the blocking member rotating unit 65, the chuck opening/closing unit 25, and the valves 32, 42, 52, 72, 82.

Figure 6:
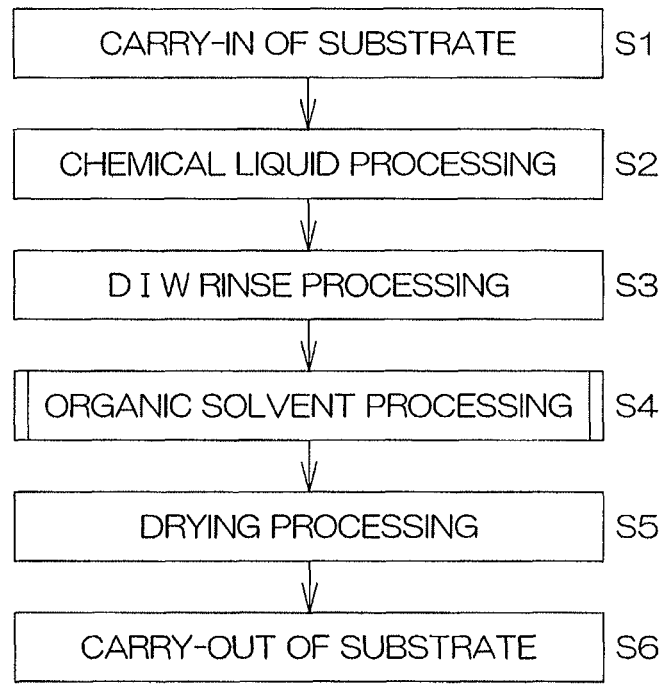
FIG. 6 is a flowchart to describe an example of a substrate processing performed by the substrate processing apparatus.

FIG. 6 is a flowchart to describe an example of a substrate processing performed by the substrate processing apparatus 1, and primarily, the substrate processing is realized by the controller 3 executing a program is shown. In the substrate processing by the substrate processing apparatus 1, for example, as shown in FIG. 6, a carry-in of substrate (S1), a chemical liquid processing (S2), a DIW rinse processing (S3), an organic solvent processing (S4), a drying processing (S5) and a carry-out of substrate (S6) are executed in this order.

In the substrate processing, first, an unprocessed substrate W is carried from the carrier C into the processing unit 2 by the transfer robots IR and CR, and is delivered to the spin chuck 5 (S1). Thereafter, the substrate W is held horizontally at a distance above the upper surface of the spin base 21, until the substrate W is carried out by the transfer robot CR (a substrate holding step). In the substrate holding step, the chuck opening/closing unit 25 causes the chuck pin 20 to hold the peripheral edge of the substrate W.

Next, the chemical liquid processing (S2) is started, after the transfer robot CR retreats to the outside of the processing unit 2.

The electric motor 23 rotates the spin base 21. Thus, the substrate W which is held horizontally by the chuck pin 20 is rotated (a substrate rotating step). On the other hand, the chemical liquid moving unit 35 places the chemical liquid nozzle 30 at a chemical liquid processing position above the substrate W. When the chemical liquid nozzle 30 positions at the chemical liquid processing position, the chemical liquid discharged from the chemical liquid nozzle 30 is put on the rotation center position of the upper surface of the substrate W.

Therefore, the chemical liquid supply valve 32 is opened. Thus, the chemical liquid is discharged (supplied) from the chemical liquid nozzle 30 toward the upper surface of the substrate W in a rotational state. The chemical liquid supplied is spread to the entire of the upper surface of the substrate W by a centrifugal force. Thus, the upper surface of the substrate W is processed with the chemical liquid.

After the chemical processing for a certain period of time, the DIW rinse processing is performed. In the DIW rinse processing (S3), the chemical liquid is removed from the substrate W by replacing the chemical liquid on the substrate W with the DIW.

First, the rinse liquid moving unit 45 places the rinse liquid nozzle 40 at a rinse liquid processing position above the substrate W. When the rinse liquid nozzle 40 positions at the rinse liquid processing position, the rinse liquid discharged from the rinse liquid nozzle 40 is put on the rotation center position of the upper surface of the substrate W.

Then, the chemical liquid supply valve 32 is closed, and the rinse liquid supply valve 42 is opened. Thus, the rinse liquid is supplied (discharged) from the rinse liquid nozzle 40 toward the upper surface of the substrate W (a processing liquid supplying step). The rinse liquid, which is discharged from the rinse liquid nozzle 40, is put on the central region of the upper surface of the substrate W. The DIW supplied to the substrate W is spread to the entire of the upper surface of the substrate W by a centrifugal force. The chemical liquid on the substrate W is washed out by this rinse liquid. During this time, the chemical liquid moving unit 35 moves the chemical liquid nozzle 30 from above the substrate W to the retreat position.

After the DIW rinse processing for a certain period of time, the organic solvent processing (S4), in which the substrate W is dried, is performed. Specifically, the organic solvent nozzle moving unit 75 moves the organic solvent nozzle 70 to an organic solvent position. When the organic solvent nozzle 70 positions at the organic solvent processing position, the organic solvent discharged from the organic solvent nozzle 70 is put on the rotation center position of the upper surface of the substrate W.

Then, the rinse liquid supply valve 42 is closed and the organic solvent valve 72 is opened. The organic solvent, such as IPA, which is supplied (discharged) from the organic solvent nozzle 70, is put on the central region of the upper surface of the substrate W. The organic solvent which is supplied onto the substrate W is spread to the entire of the upper surface of the substrate W by a centrifugal force. The rinse liquid on the substrate W is replaced with this organic solvent (a replacing step). During this time, the rinse liquid moving unit 45 moves the rinse liquid nozzle 40 from above the substrate W to the retreat position.

Then, by continuing supplying the organic solvent to the upper surface of the substrate W, a liquid film of the organic solvent is formed on the upper surface of the substrate W (a liquid film forming step). Thereafter, by heating the substrate W by means of the heating fluid supplied from the heating fluid nozzle 80, an opening of the organic solvent is formed in a central region of the liquid film (an opening forming step). Thereafter, by enlarging this opening (an opening enlarging step), the organic solvent is removed from the upper surface of the substrate W (an enlarging removing step).

After the organic solvent processing (S4) for a certain period of time, the drying processing (S5) is performed. Specifically, the electric motor 23 rotates the substrate at a high rotational speed (for example, 3000 rpm) which is faster than the rotational speed of the substrate W in the chemical liquid processing (S2) and in the rinse liquid processing (S3). Thus, a large centrifugal force acts on the organic solvent on the upper surface of the substrate W, so that the organic solvent on the upper surface of the substrate W is spun off around the substrate W. Like this, the rinse liquid is excluded from the substrate W, and the substrate W is dried. Then, when a predetermined time has elapsed since the start of the high speed rotation of the substrate W, the electric motor 23 stops the rotation of the substrate W by the spin base 21.

Thereafter, the transfer robot CR enters the processing unit 2, scoops an already-processed substrate W from the spin chuck 5, and carries it out of the processing unit 2 (S6). The substrate W is delivered from the transfer robot CR to the transfer robot IR, and is stored in the carrier C by means of the transfer robot IR.

Next, the organic solvent processing (S4 in FIG. 6) will be described.

Figure 7:
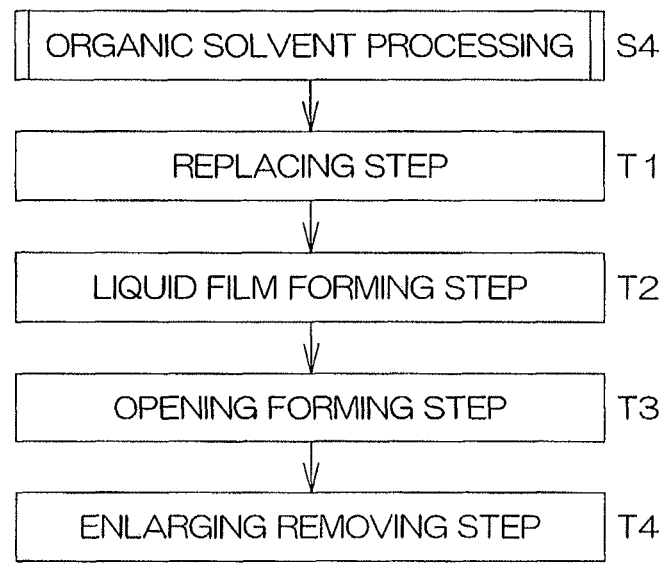
FIG. 7 is a flowchart to describe an example of an organic solvent processing of the substrate processing.

FIG. 7 is a flowchart to describe an example of the organic solvent processing of the substrate processing. FIG. 8A to FIG. 8E are schematic sectional views for explaining the organic solvent processing (S4 of FIG. 6). As shown in FIG. 7, in the organic solvent processing, the replacing step T1, the liquid film forming step T2, the opening forming step T3, the enlarging removing step T4 is executed in this order.

Referring to FIG. 8A, in the replacing step T1, the organic solvent nozzle moving unit 75 moves the organic solvent nozzle 70 to the organic solvent processing position. Then, the organic solvent valve 72 is opened to supply the organic solvent such as IPA to the upper surface of the substrate W. Thus, the rinse liquid, such as DIW, on the upper surface of the substrate W is replaced with the organic solvent.

In the replacing step T1, the heating fluid valve 82 is opened to supply the heating fluid, such as hot water, to the central region of the lower surface of the substrate W. Thus, the heating fluid spread to the entire of the lower surface of the substrate W, so that the substrate W is heated by the heating fluid. A temperature of the heating fluid is, for example, 80° C. to 85° C. Therefore, a temperature of the central region of the substrate W reaches 77° C. to 82° C. The amount of heat of the heating fluid is deprived until the heating fluid reaches an outer periphery of the substrate W, since heat exchange between the substrate W and the heating fluid begins immediately after the heating fluid reaches the center of the lower surface of the substrate W. Therefore, a temperature of the outer periphery of the substrate W becomes about 71° C. Therefore, the temperature of the organic solvent on the substrate W is lower than a boiling point (82.6° C.) of IPA.

In the replacing step T1, the blocking member raising/lowering unit 64 places the blocking member 6 at the upper position. Also, in the replacing step T1, the electric motor 23 rotates the spin base 21 at for example 300 rpm. At this time, the blocking member rotating unit 65 may synchronously rotate the blocking member 6 with the spin base 21. Synchronous rotation means rotating at the same speed in the same direction.

Referring to FIG. 8B, in the liquid film forming step T2, after the rinse liquid on the substrate W is replaced with the organic solvent, supplying of the organic solvent from the organic solvent nozzle 70 to the upper surface of the substrate W is continued. Thus, the liquid film 100 of the organic solvent is formed on the upper surface of the substrate W. A thickness of the liquid film 100 which is formed in the liquid film forming step T2, is for example about 1 nm.

In the liquid film forming step T2, heating of the substrate W is weakened. Specifically, while continuing supplying the organic solvent to the upper surface of the substrate W, the heating fluid valve 82 is closed. Thus, supplying to the center of the lower surface of the substrate W is stopped. The temperature of the organic solvent on the substrate W during supplying of the heating fluid in the replacing step T1 is lower than the boiling point (boiling point of IPA: 82.6° C.) of the organic solvent, so that the temperature of the organic solvent on the substrate W after stopping supplying of the heating fluid is kept a temperature which is lower than the boiling point of the organic solvent. That is, the liquid film forming step T2 includes a step of forming the liquid film 100 on the upper surface of the substrate W in a state where the temperature of the organic solvent on the substrate W is kept below or equal to the boiling point of the organic solvent.

In the liquid film forming step T2, the electric motor 23 decelerates rotation of the spin base 21 to decelerates rotation of the substrate W compared to the replacing step T1. Specifically, the electric motor 23 rotates the substrate W at a speed at which the liquid film 100 on the substrate W does not split on the substrate W (the liquid film 100 is held on the substrate W). A rotational speed of the substrate W at this time is called a liquid film holding speed. The liquid film holding speed is, for example, 10 rpm. The liquid film holding speed may be kept constant in a speed range where the liquid film 100 is not split on the substrate W. Also, the liquid film holding speed may be changed in the speed range where the liquid film 100 is not split on the substrate W. The blocking member 6 synchronously rotates with the spin base 21.

Referring to FIG. 8C, in the opening forming step T3, while stopping supplying the organic solvent to the central region of the upper surface of the substrate W, the heating of the substrate W is strengthened. Thus, the opening 101 is formed in the central region of the liquid film 100.

Specifically, supplying of the organic solvent from the organic solvent nozzle 70 to the upper surface of the substrate W is stopped by closing the organic solvent valve 72. Also, supplying the heating fluid to the center of the lower surface of the substrate W is resumed by opening the heating fluid valve 82. Thus, the central region of the substrate W is heated, so that the temperature of the central region of the liquid film 100 reaches higher than the temperature of the liquid film 100 in the liquid film forming step T2. Thereby, the surface tension of the organic solvent on the central region of the substrate W is reduced and the liquid film 100 becomes thin only in the central region of the substrate W (See to the two-dot chain line in FIG. 8C). The temperature of the organic solvent of the central region of the liquid film 100 rises, so that evaporation of the organic solvent is promoted and eventually the opening 101 is formed in the central region of the liquid film 100.

In the opening forming step T3, the gas such as nitrogen gas blew toward the central region of the liquid film 100 by the gas valve 52 being opened. Therefore, forming of the opening 101 is assisted by supplying the gas to the center of the substrate W. In the opening forming step T3, as well in the liquid film forming step T2, the spin base 21 (the substrate W) is rotated at the liquid film holding speed, and the blocking member 6 synchronously rotates the spin base 21.

In the opening forming step T3, before resuming heating to the substrate W and blowing the gas onto the upper surface of the substrate W, the organic solvent nozzle moving unit 75 moves the organic solvent nozzle 70 to the retreat position. And, in the opening forming step T3, before resuming heating to the substrate W and blowing the gas onto the upper surface of the substrate W, the blocking member raising/lowering unit 64 moves the blocking member 6 to a blocking position which is between the upper position and the lower position. In a state where the blocking member 6 positions at the blocking position, a portion which is lower than the protrusion part 66 in the annular part 61, faces the substrate W from outward in the substrate rotational radial direction. Thus, the atmosphere between the facing part 60 of the blocking member 6 and the upper surface of the substrate W is blocked from the surrounding atmosphere.

Referring to FIG. 8D and FIG. 8E, in the enlarging removing step T4, specifically, by continuing heating to the central region of the substrate W, the opening 101 is enlarged toward the peripheral edge of the substrate W (the opening enlarging step), thereby, the liquid film 100 is removed from the upper surface of the substrate W. FIG. 8E shows a state after FIG. 8D, and shows a state where a peripheral edge 101a of the opening 101 reaches the peripheral edge of the substrate W.

In the enlarging removing step T4, blowing of the gas such as nitrogen gas toward the central region of the substrate W is continued. Therefore, expansion of the opening 101 is assisted by supplying the gas to the center of the substrate W. In the enlarging removing step T4, as well in the liquid film forming step T2 and in the opening forming step T3, the spin base 21 (the substrate W) is rotated at the liquid film holding speed.

Specifically, in the enlarging removing step T4, the blocking member raising/lowering unit 64 moves the blocking member 6 from the blocking position to the lower position. Before the blocking member 6 is moved from the blocking position to the lower position, the blocking member rotating unit 65 adjusts a phase between the blocking member 6 and the spin base 21 in the rotational direction around the rotational axis A1, such that the protrusion part 66 and the chuck pin 20 do not overlap in plan view. If the blocking member 6 and the spin base 21 synchronously rotate such that the protrusion part 66 and the chuck pin 20 do not overlap in plan view, adjusting the phase of the blocking member 6 and the spin base 21 in the rotational direction around the rotational axis A1 can be omitted.

By moving the blocking member 6 to the lower position, the protrusion part 66 of the blocking member 6 approaches the peripheral edge of the substrate W from above. As shown in FIG. 8D, it is preferable that the blocking member 6 moves to the lower position before the peripheral edge 101a of the opening 101 reaches the vicinity of the peripheral edge Wa of the substrate W (before entering the state of FIG. 8E). Thus, the protrusion part 66 of the blocking member 6 approaches the peripheral edge Wa of the substrate W and the protrusion part 66 is in contact with the liquid film 100, such that the gap G1 (see FIG. 4) is formed between the protrusion part 66 of the blocking member 6 and the peripheral edge Wa of the substrate W (a liquid film contact step). In this state, the protrusion part 66 is close to the part Wc in the peripheral edge of the substrate W, which is different from the part Wb which is held by the chuck pin 20 (see FIG. 3, and FIG. 10B to be described later). The liquid film contact step is performed after starting the opening forming step T3. Specifically, the liquid film contact step is performed in parallel with the enlarging removing step T4.

Figure 9A:
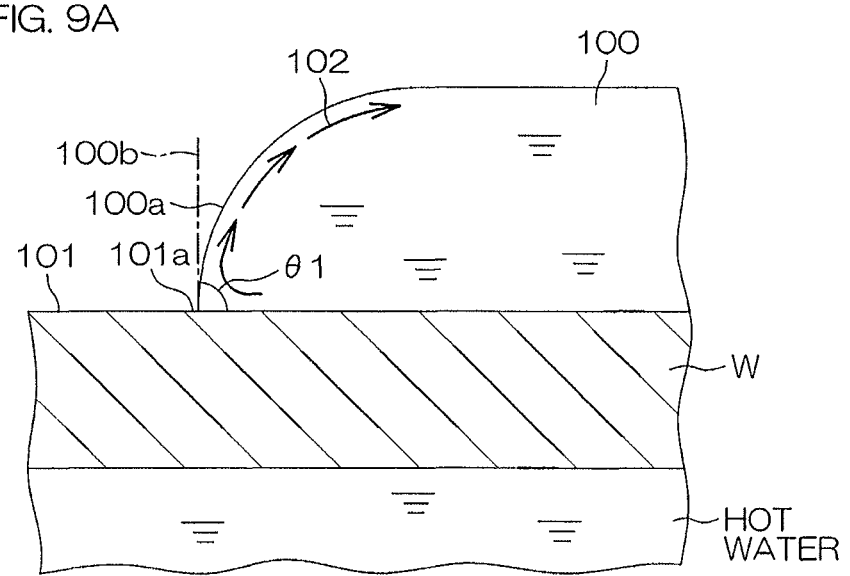
FIG. 9A is a schematic view of a vicinity of a peripheral edge of an opening in an enlarging removing step.
Figure 9B:
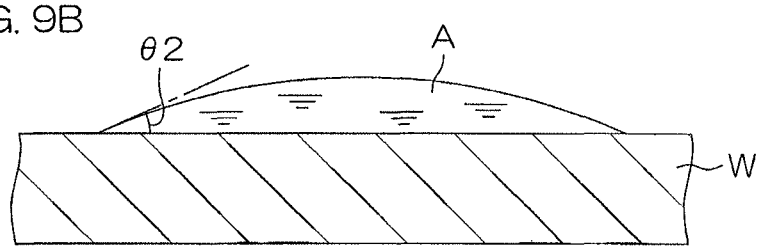
FIG. 9B is a schematic view of a vicinity of a liquid droplet of an organic solvent dropped onto a substrate in a non-rotating state.

FIG. 9A is a schematic view of a vicinity of the peripheral edge 101a of the opening 101 in the enlarging removing step T4. FIG. 9B is a schematic view of a vicinity of a liquid droplet of the organic solvent dropped onto the substrate W in a non-rotating state.

As shown in FIG. 9A, in the enlarging removing step T4, by heating of the substrate W, a convection 102 in the direction way from the upper surface of the substrate W occurs inside the liquid film 100 at a gas liquid interface 100a of the liquid film 100, which positions at the peripheral edge 101a of the opening 101. This convection 102 occurs due to the liquid temperature being higher as a portion closer to the upper surface of the substrate W inside the liquid film 100. The convection 102 occurs along the direction away from the upper surface of the substrate W and forms a flow along the gas liquid interface 100a, so that the convection 102 causes a spontaneous movement of the liquid film 100 toward a direction the opening 101 expands.

In the enlarging removing step T4, the gas liquid interface 100a of the liquid film 100 which positions at the peripheral edge 101a of the opening 101 is in contact with the upper surface of the substrate W at an angle θ1 which is larger than a contact angle 82 (see FIG. 9B) of the organic solvent to the upper surface of the substrate W. This state occurs when spontaneous movement of the liquid film 100 due to the convection 102 occurs. The contact angle θ2 is an angle which is formed between the gas liquid interface of the droplet A of the organic solvent and the upper surface of the substrate W inside the liquid film 100. The contact angle 81 is an angle which is formed between a tangent line 101b and the upper surface of the substrate W inside the liquid film 100. The tangent line 101b is a tangent line which is drawn with a intersection point of a curve, which is formed by the gas liquid interface 100a on a plane orthogonal to the gas liquid interface 100a and the upper surface of the substrate W, as a point of contact. Outside than the peripheral edge 101a of the opening 101 means a side that is opposite the rotation center position with respect to the peripheral edge 101a. The angle θ1 is preferably not less than 45 degrees.

The substrate W may be rotated so that a centrifugal force acts on the liquid film 100 or the gas may be supplied inside the opening 67 so that a blowing force due to the gas acts on the peripheral edge 101a of the opening 101 of the liquid film 100. Even in such cases, it is preferable for the gas liquid interface 101a of the liquid film 100 at the peripheral edge 101a of the opening 101 to be in contact with the upper surface of the substrate W at the angle θ1 (for example, an angle not less than 45 degrees) that is larger than the contact angle θ2 of the organic solvent with respect to the substrate W. If so, it may be said that a dominant mechanism for the movement of the liquid film 100 (enlargement of the opening 101) is the spontaneous movement due to the convection 102 inside the liquid film 100.

The liquid film 100 has a thickness of approximately 1 mm and is sufficiently thick, so that a temperature difference between the upper surface of the substrate W and an upper surface of the liquid film 100 thus tends to be large and the convention 102 thereby occurs readily inside the liquid film 100. The convention 102 occurs even more readily, if inside the liquid film 100, a difference between the temperature of the organic solvent at a vicinity of the upper surface of the substrate W and the temperature of the organic solvent at a vicinity of the upper surface of the liquid film 66 is 30° C. to 35° C.

In the enlarging removing step T4, it is preferable to control the heating fluid valve 82 and the electric motor 23 to control heating or rotating of the substrate W, such that a moving speed of the liquid film 100 due to the convection 102 inside the liquid film 100 is faster than a sum of the moving speed of the liquid film 100 due to a centrifugal force acts on the liquid film 100 and the moving speed of the liquid film 100 by blowing of the gas such as nitrogen gas. The moving speed of the liquid film 100 is a speed at which the peripheral edge 101a of the opening 101 moves in the direction away from the rotation center position of the substrate W.

Figure 10A:
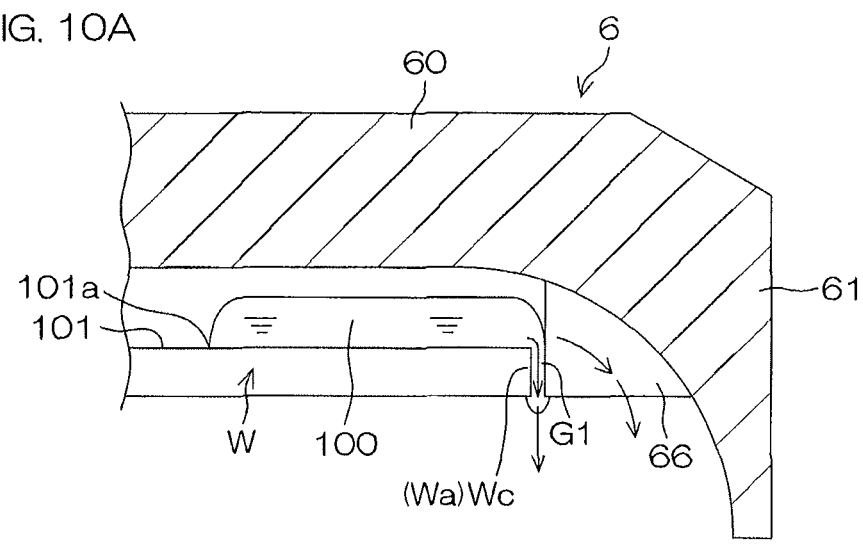
FIG. 10A is a schematic view of a vertical section of the proximity member in a liquid film contacting step in the organic solvent treatment (S4 in FIG. 6).

According to the first embodiment, in the liquid film forming step T2, the liquid film 100 of the organic solvent such as IPA is formed on the upper surface of the substrate W, and, in the opening forming step T3, the opening 101 is formed in the central region of the liquid film 100. Thereafter, in the enlarging removing step T4, by enlarging the opening 101 toward the peripheral edge of the substrate W, the liquid film 100 is removed from the upper surface of the substrate W. After starting the opening forming step T3, the protrusion part 66 of the blocking member 6 approaches the peripheral edge Wa of the substrate W and is contact with the liquid film 100. Therefore, even if a force, which pushes the organic solvent out of the substrate W, is reduced due to the peripheral edge 101a of the opening 101 approaching the peripheral edge Wa of the substrate W as the opening 101 is enlarged, the organic solvent at the vicinity of the peripheral edge Wa of the substrate W is discharged outside the substrate W along the protrusion part 66 (see FIG. 10A). Thus, the lumpy liquid film 100 can be removed from the upper surface of the substrate W without splitting the liquid film 100. Therefore, the organic solvent on the substrate W can be satisfactorily removed without remaining droplets of the organic solvent on the upper surface of the substrate W.

According to the first embodiment, the liquid film contact step is performed in parallel with the enlarging removing step T4. Thus, in the enlarging removing step T4, the organic solvent at the vicinity of the peripheral edge of the substrate W is discharged outside the substrate W along the protrusion part 66. Therefore, the organic solvent on the upper surface of the substrate W can be efficiently excluded without stopping enlargement of the opening 101.

Figure 10B:
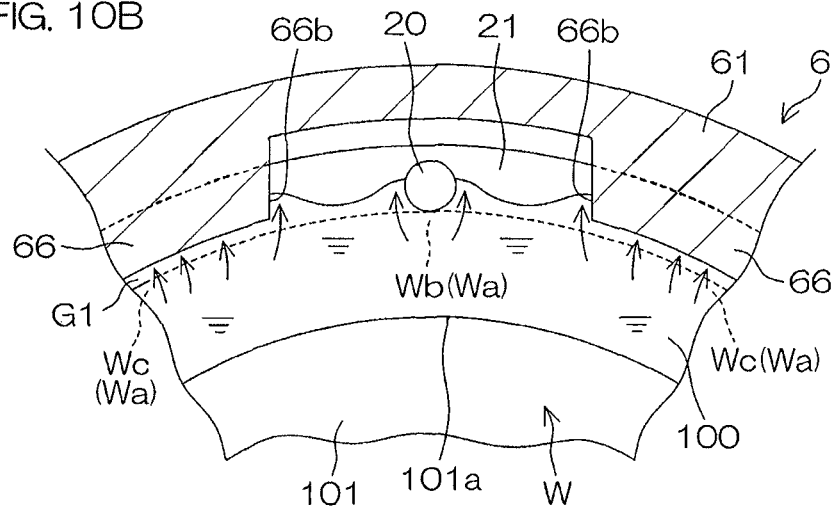
FIG. 10B is a schematic view of a transverse section of the proximity member in the liquid film contacting step in the organic solvent treatment (S4 in FIG. 6).

According to the first embodiment, in the liquid film contact step, the protrusion part 66 of the blocking member 6 is brought close to the peripheral edge Wa of the substrate W, such that the gap G1 is formed between the protrusion part 66 of the blocking member 6 and the peripheral edge Wa of the substrate W. Thus, the organic solvent at the vicinity of the peripheral edge Wa of the substrate W can pass through the gap G1. Therefore, as shown in FIG. 10B, in the liquid film contact step, the organic solvent is not only excluded outside the substrate W along a circumferential end face 66b of the protrusion part 66, but also excluded outside the substrate W through the gap G1 between the protrusion part 66 and the peripheral edge Wa of the substrate W. Thus, compared to a configuration in which the peripheral edge Wa of the substrate W and the protrusion part 66 are in contact, the organic solvent, which positions at the vicinity of the peripheral edge Wa of the substrate W, can be efficiently excluded outside the substrate W.

According to the first embodiment, the chuck pin 20 which is provided on the upper surface of the spin base 21, holds the peripheral edge the substrate W. And, in the liquid film contact step, the protrusion part 66 approaches the part Wc of the peripheral edge Wa of the substrate W, which is different from the part Wb which is held by the chuck pin 20.

Referring to FIG. 10B, the organic solvent at the vicinity of the peripheral edge Wa of the substrate W is not only excluded outside the substrate W along the protrusion part 66, but also excluded outside the substrate W along the chuck pin 20 which holds the peripheral edge Wa of the substrate W. The protrusion part 66 is brought close to the part Wc of the peripheral edge Wa of the substrate W, which is different from the part Wb which is held by the chuck pin 20, so that the organic solvent at the vicinity of the peripheral edge Wa of the substrate W is excluded outside the substrate W due to both of the chuck pin 20 and the protrusion part 66. Therefore, the organic solvent, which is located at the vicinity of the peripheral edge Wa of the substrate W, is excluded outside the substrate W.

According to the first embodiment, the protrusion part 66 (the proximity member) is provided in the blocking member 6 which faces the upper surface of the substrate W and blocks the atmosphere between the blocking member 6 and the substrate W from the surrounding atmosphere. And, in the liquid film contact step, the protrusion part 66 of the blocking member 6 approaches the peripheral edge Wa of the substrate W from above. By bringing the protrusion part 66 of the blocking member 6 close to the peripheral edge Wa of the substrate W from above, the protrusion part 66 of the blocking member 6 can be brought into contact with the liquid film 100. the blocking member 6 blocks the atmosphere between the substrate W and the facing surface 60a of the blocking member 6, so that contamination of the liquid film 100 and the substrate W due to the surrounding atmosphere can be suppressed or prevented.

According to the first embodiment, in the liquid film forming step T2, the liquid film 100 is formed on the upper surface of the substrate W in the state where the temperature of the organic solvent such as IPA on the substrate W is kept below or equal to the boiling point (for example 82.6° C.) of the organic solvent. Thus, the temperature of the organic solvent on the substrate W is kept below or equal to the boiling point, evaporation of the organic solvent can be suppressed. Therefore, splitting of the liquid film 100 due to evaporation of the organic solvent can be suppressed or prevented. Accordingly, the lumpy liquid film 100 can be removed to the outside of the substrate W, so that the organic solvent on the substrate W can be satisfactorily removed without remaining the organic solvent on the upper surface of the substrate W.

According to the first embodiment, in the opening forming step T3, by raising the temperature of the central region of the liquid film 100 higher than the temperature of the liquid film 100 in the liquid film forming step T2, the opening 101 is formed in the liquid film 100. Thus, the opening 101 is formed in the central region of the liquid film 100 of the organic solvent. Therefore, the opening 101 can be spread from the central region of the substrate W toward the peripheral edge Wa of the substrate W evenly. Therefore, the organic solvent can be evenly removed from the upper surface of the substrate W.

According to the first embodiment, in the enlarging removing step T4, the substrate W is heated, such that the convection 102 occurs at the gas liquid interface 100a of the liquid film which positions at the peripheral edge 101a of the opening 101. Thereby, the opening 101 is enlarged toward the peripheral edge Wa of the substrate W. Thus, the convection 102 in the direction away from the substrate W occurs at the gas liquid interface 100a, which is positions at the peripheral edge 101a of the opening 101 which is formed in the central region of the liquid film 100, of the liquid film 100. This convection 102 causes the spontaneous movement toward the direction of widening the opening 101, thereby the opening 101 is enlarged. Therefore, the organic solvent can be removed from the substrate W more satisfactorily without splitting the lumpy liquid film 100.

Moreover, according to the first embodiment, in the replacing step T1, the organic solvent is supplied to the upper surface of the substrate W while excluding the rinse liquid due to a centrifugal force which is generated by rotation of the substrate W. Therefore, the rinse liquid on the substrate W can be efficiently replaced with the organic solvent. Also, in the liquid film forming step T2, the centrifugal force can be reduced by decelerating rotation of the substrate W. Thus, the amount of the organic solvent which is removed from the substrate W is reduced, so that the liquid film 100 can be satisfactorily formed. Also, in the opening forming step T3 and in the enlarging removing step T4, by rotating the substrate W at a lower speed than the rotational speed in the replacing step T1, a state where the spontaneous movement of the liquid film 100 due to heating is dominant happens, and the spontaneous movement of the liquid film 100 can be assisted by an appropriate centrifugal force.

Moreover, according to the first embodiment, the speed of the spontaneous movement of the liquid film 100 due to the convection 102 is faster than the speed of the liquid film 100 due to a centrifugal force which acts on the liquid film 100, so that the amount of the organic solvent, which is removed from the substrate W due to the centrifugal force, can be suppressed. Thereby, splitting of the liquid film 100 on the substrate W can be further suppressed. Thus, the organic solvent on the substrate W can be more satisfactorily excluded.

Also, the substrate W rotates at the speed range where the liquid film 100 is not split on the substrate W, so that the liquid film 100 can be excluded outside the substrate W while maintaining a state of liquid mass and assisting movement of the liquid film 100.

Also, the organic solvent nozzle 70 supplies the organic solvent of which the temperature is lower than the substrate W, so that the convection 102 inside the liquid film 100 is likely to occur due to the temperature difference between the substrate W and the organic solvent. More specifically, it is preferable that the temperature of the organic solvent is lower than the temperature of the substrate W at a vicinity of a heating position by the heating fluid of the heating fluid nozzle 80. Thereby, the convection 102 from the substrate W toward the upper surface of the liquid film 100 can be caused at the vicinity of the heating position and promoted. Therefore, the liquid film 100 can be efficiently excluded outside the substrate W due to the spontaneous movement of the liquid film 100 on the substrate W.

Also, by supplying the heating fluid toward the center of the lower surface of the substrate W, evaporation of the organic solvent of the liquid film 100 at the vicinity of the center (the central region) of the substrate W can be promoted and a starting point of the convection 102 inside the liquid film 100 can be placed in the central region of the substrate W. Thereby, the liquid film 100 can be excluded outside the substrate W by creating the opening 101 in the liquid film 100 at the center of the substrate W, that is, a center position of the liquid film 100 and moving the liquid film 100 so as to spread the opening 101 outward.

Second Preferred Embodiment

Figure 11:
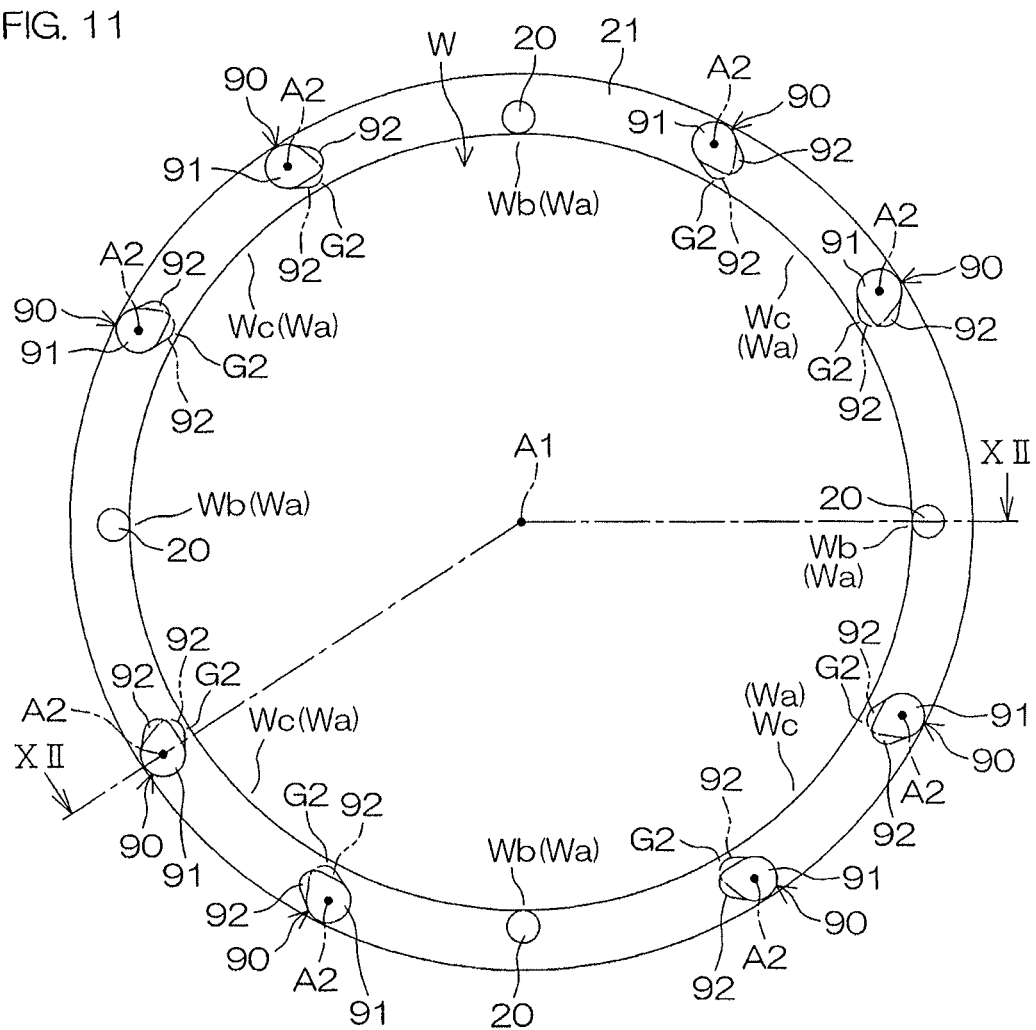
FIG. 11 is a schematic view when a vicinity of the base of the substrate processing apparatus according to a second preferred embodiment of the present invention is viewed in a plan view.
Figure 12:
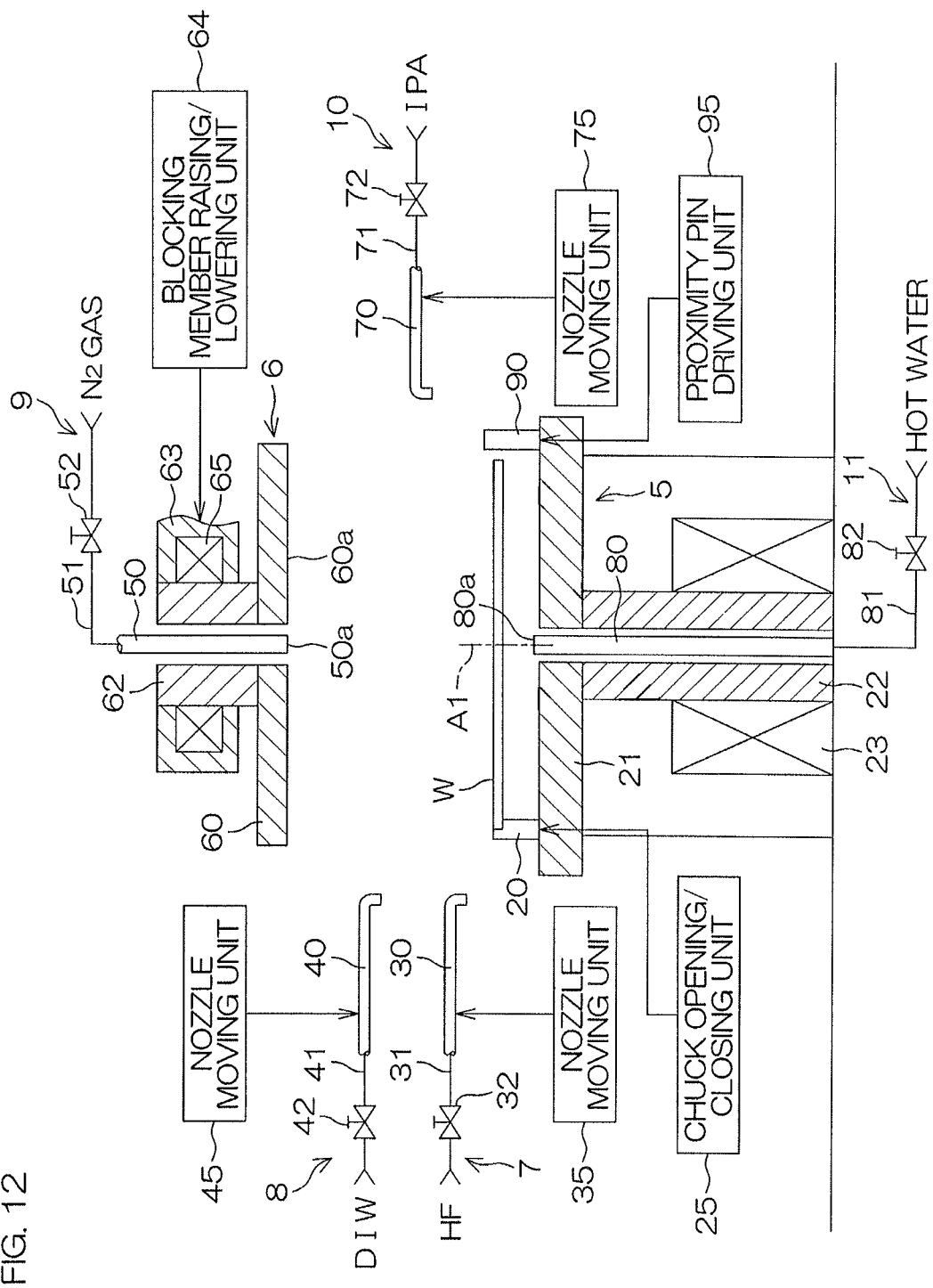
FIG. 12 is an schematic sectional view to explain a configuration example of a processing unit included in the substrate processing apparatus according to the second embodiment, and shows a cross section taken along line XII-XII of FIG. 11.

FIG. 11 is a schematic view when a vicinity of the spin base 21 of the substrate processing apparatus 1P according to the second preferred embodiment of the present invention is viewed in a plan view. FIG. 12 is a schematic view to explain a configuration example of the processing unit 2 included in the substrate processing apparatus 1P, and shows a cross section taken along line XII-XII of FIG. 11. In FIG. 11 and FIG. 12, the same reference numerals are given to the same members as those described so far, and the description thereof is omitted (this also applies to FIG. 13A and FIG. 13B to be described later).

Referring to FIG. 11 and FIG. 12, the point, at which the substrate processing apparatus 1P is mainly different from the substrate processing apparatus 1 (see FIG. 2) according to the first embodiment, is a point at which the processing unit 2 includes a plurality of proximity pins 90 which are provided on the upper surface of the spin base 21 and can approach the peripheral edge of the substrate W, and a proximity pin driving unit 95 which rotates each proximity pin 90 around a pivot axis A2 along the vertical direction and passing through each proximity pin 90.

The proximity pin 90 has, for example, a columnar shape which extends in the vertical direction. The proximity pin 90 is substantially elliptical in plan view. The proximity pin 90 is arranged between the chuck pins 20 which are adjacent in the rotational direction around the rotational axis A1. In this embodiment, the four chuck pins 20 are arranged at intervals of 90° in total in the rotational direction of the substrate W. The two proximity pins 90 are arranged at equal intervals between the chuck pins 20 which are adjacent in the rotational direction of the substrate W.

The proximity pin 90 includes a supported part 91 which is pivotably supported by the spin base 21, a extension part 92 which is provided integrally with the supported part 91 and extends outward in a rotational radial direction of a pivot axis A2. The proximity pin driving unit 95 includes an electric motor applies a rotational force around the pivot axis A2 to the supported part 91 of the proximity pin 90.

The proximity pin 90 is pivoted around the pivot axis A2 by the proximity pin driving unit 95, so that the extension part 92 of the proximity pin 90 gets close to the peripheral edge Wa of the substrate W and gets away from the peripheral edge Wa of the substrate W. A position (a position of the proximity pin 90 indicated by a two-dot chain in FIG. 11) of the proximity pin 90 when the extension part 92 is closest to the peripheral edge Wa of the substrate W is called a proximity position. A position (a position of the proximity pin 90 indicated by solid line in FIG. 11) of the proximity pin 90 when the extension part 92 is most separated from the peripheral edge Wa of the substrate W is called a separation position.

In a state where the proximity pin 90 positions at the proximity position, a gap G2 is formed between the extension part 92 of the proximity pin 90 and the peripheral edge Wa of the substrate W. In the state where the proximity pin 90 positions at the proximity position, the extension part 92 of the proximity pin 90 is close to the part Wc, which is different from the part Wb which is held by the chuck pin 20, in the peripheral edge Wa of the substrate W.

As described above, the proximity pin 90 is an example of the proximity member which can get close to the peripheral edge of the substrate W. The proximity pin driving unit 95 functions as the relative position changing unit which changes a relative position between the proximity pin 90 as the proximity member and the substrate W.

Unlike the blocking member 6 according to the first embodiment, the blocking member 6 according to the second embodiment is not provided with the annular part 61 and the protrusion part 66. The controller 3 according to the second embodiment controls the proximity pin driving unit 95 (see a two-dot chain in FIG. 5).

FIG. 13A and FIG. 13B are schematic sectional views for explaining the organic solvent process (S4 of FIG. 6) in a substrate processing performed by the substrate processing apparatus 1P. FIG. 13B shows a state after FIG. 13A and shows a state where the peripheral edge 101a of the opening 101 has reached the peripheral edge Wa of the substrate W.

In the substrate processing by the substrate processing apparatus 1P, the similar substrate processing to the substrate processing by the substrate processing apparatus 1 according to the first embodiment is possible. However, as shown in FIG. 13A and FIG. 13B, in the enlarging removing step T4, the proximity pin driving unit 95 pivots the proximity pin 90 around the pivot axis A2 to cause the proximity pin 90 to come close to the peripheral edge Wa of the substrate W from the outside in the substrate rotational radial direction (from the outside of the substrate W) and to cause (the extension part 92 of) the proximity pin 90 into contact with the liquid film 100 (a liquid film contact step).

Therefore, according to the second embodiment, even if a force, which pushes the organic solvent out of the substrate W, is reduced due to the peripheral edge 101a of the opening 101 approaching the peripheral edge Wa of the substrate W as the opening 101 is enlarged, the organic solvent at the vicinity of the peripheral edge Wa of the substrate W is discharged outside the substrate W along the proximity pin 90 (see bold arrows in FIG. 13B). Thus, the lumpy liquid film 100 can be removed from the upper surface of the substrate W without splitting the liquid film 100. Therefore, the organic solvent on the substrate W can be satisfactorily removed without remaining droplets of the organic solvent on the upper surface of the substrate W.

According to the second embodiment, in the liquid film contact step, the extension part 92 of the proximity pin 90 is brought close to the peripheral edge Wa of the substrate W, such that the gap G2 is formed between the extension part 92 of the proximity pin 90 and the peripheral edge Wa of the substrate W. Thus, the organic solvent which positions at the peripheral edge Wa of the substrate W can pass through the gap G2. Therefore, as indicated by thick arrows in FIG. 13B, in the liquid film contact step, the organic solvent is not only excluded outside the substrate W along the proximity pin 90 but also excluded outside the substrate W through the gap G2 between the extension part 92 and the peripheral edge Wa of the substrate W. Thus, compared to a configuration in which the peripheral edge Wa of the substrate W and the extension part 92 are in contact, the organic solvent, which positions at the vicinity of the peripheral edge Wa of the substrate W can be efficiently excluded outside the substrate W.

According to the second embodiment, the proximity pin 90, which is provided on the upper surface of the spin base 21, functions the proximity member. And, in the liquid film contact step, the proximity pin 90 is brought close to the peripheral edge Wa of the substrate W from the outside in the substrate rotational radial direction (from the outside of the substrate W). Thus, it is possible to bring the proximity pin 90 into contact with the liquid film 100 with a simple configuration of bringing the proximity pin 90 which is provided on the spin base 21 from the outside of the substrate W to the peripheral edge Wa of the substrate. Therefore, there is no need to purposely set up a member which is independent from the spin base 21.

According to the second embodiment, in addition to the above-described effects, the same effects as those of the first embodiment are achieved.

The present invention is not limited to the embodiments described above, and can be implemented in still another embodiment.

For example, in the opening forming step T3, the opening 101 is formed in the liquid film 100 by heating the substrate W, but the opening 101 is formed in the liquid film 100 only by blowing the gas, without heating the substrate W.

Also, the heating fluid supplying unit 11 may heat not only the central region of the substrate W but also an outer circumferential region of the substrate W. Specifically, the heating fluid supplying unit 11 may have a heating fluid nozzle which has a form of a bar nozzle which extends in the rotational radial direction from a tip of the heating fluid nozzle 80. Thus, the outer circumferential region of the substrate W is heated. The outer circumferential region is a region outside the substrate W than the position (the central region) where the heating fluid nozzle 80 can heat particularly by supplying fluid to the center of the lower surface of the substrate W. Also, the heating fluid supplying unit 11 may have a plurality of heating fluid nozzles which are arranged at a plurality of positions with different distance from the center of the substrate W and supply the heating fluid toward positions away from the center of the lower surface of the substrate W, in addition to the heating fluid nozzle 80. By heating the outer circumferential region of the substrate W, evaporation of the organic solvent at the outer circumferential region can be accelerated, so that the liquid film 100 can be efficiently excluded.

Also, the spin base 21 may be provided with a heater as a substrate heating unit. The heater is built in the spin base 21 and a resistor extending in the rotational radial direction. The heater faces the substrate W from below. The heater faces an annular region of the lower surface of the substrate W by rotating the substrate W around the rotational axis A1. The annular region is a region ranging from a predetermined position away from the central region, including the center, of the substrate W to the outer periphery of the substrate W.

Also, in the embodiment described above, in the enlarging removing step T4, the enlargement of the opening 101 is assisted by supplying the gas to the substrate W. However, unlike the embodiment described above, in the enlarging removing step T4, there may be a case where supply of the gas to the substrate W is not performed.

Also, in the embodiment described above, in the enlarging removing step T4, the dominant mechanism for the movement of the liquid film 100 (the enlargement of the opening 101) is spontaneous movement due to the convection 102 in the liquid film 100. However, in the enlarging removing step T4, the dominant mechanism for the movement of the liquid film 100 need not necessarily be spontaneous movement due to the convection 102 in the liquid 100. That is, if the liquid film 100 is excluded outside the substrate W in a lump state, the dominant mechanism for the movement of the liquid film 100 may be due to a blowing force of the gas or a centrifugal force. Moreover, if the lumpy liquid film 100 is excluded outside the substrate W, in the enlarging removing step T4, the opening 101 may be enlarged only by at least of a blowing force of the gas and a centrifugal force, without heating the substrate W.

Also, in the first embodiment, by moving the blocking member 6 to the lower position, the protrusion part 66 of the blocking member 6 is brought close to the peripheral edge Wa of the substrate W. However, unlike the first embodiment, the substrate W may be raised and lowered. For example, a base raising/lowering unit which raises and lowers the spin base 21 is provided, and the base raising/lowering unit may be included in the relative position changing unit which changes the relative position of the substrate W and the protrusion part 66 the blocking member 6.

Also, unlike the embodiment described above, the gap G1 between the protrusion part 66 of the blocking member 6 and the peripheral edge Wa of the substrate W and the gap G2 between the extension part 92 of the proximity pin 90 and the peripheral edge Wa of the substrate W are not necessarily provided, and there may be cases where the gaps G1, G2 are not provided.

The present application corresponds to Japanese Patent Application No. 2017-033609 filed on Feb. 24, 2017 in the Japan Patent Office, and the entire disclosure of the present application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing method comprising:
   a substrate holding step of holding a substrate horizontally;
   a processing liquid supplying step of supplying a processing liquid, which contains water, to an upper surface of the substrate;
   a replacing step of replacing the processing liquid with a low surface tension liquid, which has lower surface tension than water, by supplying the low surface tension liquid to the upper surface of the substrate;
   a liquid film forming step of forming a liquid film of the low surface tension liquid on the upper surface of the substrate, by continuing supplying the low surface tension liquid to the upper surface of the substrate after the replacing step;
   an opening forming step of forming an opening at a central region of the liquid film;
   an enlarging removing step of removing the liquid film from the upper surface of the substrate by enlarging the opening toward a peripheral edge of the substrate; and
   a liquid film contact step of bringing a proximity member into contact with the liquid film, by bringing the proximity member close to the peripheral edge of the substrate after starting the opening forming step.

2. The substrate processing method according to claim 1, wherein the liquid film contact step is performed in parallel with the enlarging removing step.

3. The substrate processing method according to claim 1, wherein the proximity member is brought close to the substrate, such that a gap is formed between the proximity member and the peripheral edge of the substrate, in the liquid film contact step.

4. The substrate processing method according to claim 1, wherein the substrate holding step comprises a step of holding the peripheral edge of the substrate by means of a substrate holding tool which is provided on an upper surface of a base and holds the peripheral edge of the substrate, and
   in the liquid film contact step, the proximity member is brought close to a part of the peripheral edge of the substrate, which is different from a part which is held by the substrate holding tool.

5. The substrate processing method according to claim 4, wherein the proximity member is a proximity pin which is provided on the upper surface of the base, and
   in the liquid film contact step, the proximity pin is brought close to the peripheral edge of the substrate from the outside of the substrate.

6. The substrate processing method according to claim 1, wherein the proximity member is provided at a blocking member which faces the upper surface of the substrate and blocks an atmosphere between the substrate and the blocking member from a surrounding atmosphere, and,
   in the liquid film contact step, the blocking member is bought close to the peripheral edge of the substrate from above.

7. The substrate processing method according to claim 1, wherein the liquid film forming step comprises a step of forming the liquid film on the upper surface of the substrate in a state where a temperature of the low surface tension liquid on the substrate is kept below or equal to a boiling point of the low surface tension liquid.

8. The substrate processing method according to claim 7, wherein the opening forming step comprises a step of forming the opening in the liquid film, by raising a temperature of the central region of the liquid film to a temperature which is higher than the temperature of the liquid film in the liquid forming step.

9. The substrate processing method according to claim 7, wherein the enlarging removing step comprises a step of heating the substrate such that a convection in a direction away from the substrate occurs in a gas liquid interface of the liquid film which positions at the peripheral edge of the opening, thereby enlarging the opening toward the peripheral edge of the substrate.

* * * * *